United States Patent
Sugawa et al.

(10) Patent No.: US 10,200,641 B2
(45) Date of Patent: Feb. 5, 2019

(54) OPTICAL SENSOR AND SOLID-STATE IMAGING DEVICE, AND SIGNAL READING METHODS THEREFOR

(71) Applicant: TOHOKU UNIVERSITY, Sendai, Miyagi (JP)

(72) Inventors: Shigetoshi Sugawa, Sendai (JP); Rihito Kuroda, Sendai (JP); Shunichi Wakashima, Sendai (JP)

(73) Assignee: TOHOKU UNIVERSITY, Sendai, Miyagi (JP)

( * ) Notice: Subject to any disclaimer, the term of this patent is extended or adjusted under 35 U.S.C. 154(b) by 0 days.

(21) Appl. No.: 15/524,701

(22) PCT Filed: Nov. 16, 2015

(86) PCT No.: PCT/JP2015/082089
§ 371 (c)(1),
(2) Date: May 5, 2017

(87) PCT Pub. No.: WO2016/080337
PCT Pub. Date: May 26, 2016

(65) Prior Publication Data
US 2017/0324916 A1 Nov. 9, 2017

(30) Foreign Application Priority Data
Nov. 17, 2014 (JP) ................. 2014-233172

(51) Int. Cl.
*H04N 5/355* (2011.01)
*H01L 21/8234* (2006.01)
(Continued)

(52) U.S. Cl.
CPC ....... *H04N 5/3559* (2013.01); *H01L 21/8234* (2013.01); *H01L 27/088* (2013.01);
(Continued)

(58) Field of Classification Search
CPC .................................................... H04N 5/3559
(Continued)

(56) References Cited

U.S. PATENT DOCUMENTS

2007/0278536 A1 12/2007 Adachi
2009/0045319 A1 2/2009 Sugawa et al.
(Continued)

FOREIGN PATENT DOCUMENTS

EP          1 746 820      1/2007
JP          2005-328493    11/2005
(Continued)

*Primary Examiner* — Joel W Fosselman
(74) *Attorney, Agent, or Firm* — Venable LLP

(57) ABSTRACT

One problem addressed by the present invention is to provide an optical sensor, a solid-state imaging device, and methods for reading the signals therefrom, which contribute greatly to the development of industry and the realization of a safer and more secure society. One solution according to the present invention is an optical sensor having a light-receiving element, storage capacitors that store a charge, and a transfer switch for transferring to the storage capacitors a charge generated by light input to the light-receiving element, wherein the storage capacitors are a floating diffusion capacitor and a lateral overflow integration capacitor, and the transfer switch is a non-LDD/MOS transistor, that is, a non-LDD/MOS transistor for which the impurity concentration of the drain region is reduced by 50%.

6 Claims, 29 Drawing Sheets

(51) Int. Cl.
| | |
|---|---|
| *H01L 29/78* | (2006.01) |
| *H01L 27/088* | (2006.01) |
| *H04N 5/374* | (2011.01) |
| *H01L 27/146* | (2006.01) |
| *H01L 49/02* | (2006.01) |
| *H04N 5/3745* | (2011.01) |
| *H04N 5/378* | (2011.01) |
| *H04N 5/357* | (2011.01) |

(52) U.S. Cl.
CPC .. *H01L 27/14612* (2013.01); *H01L 27/14656* (2013.01); *H01L 27/14689* (2013.01); *H01L 28/40* (2013.01); *H01L 29/78* (2013.01); *H04N 5/374* (2013.01); *H04N 5/378* (2013.01); *H04N 5/3745* (2013.01); *H04N 5/37452* (2013.01); *H04N 5/357* (2013.01)

(58) Field of Classification Search
USPC ...................................................... 348/230.1
See application file for complete search history.

(56) References Cited

U.S. PATENT DOCUMENTS

| | | | |
|---|---|---|---|
| 2010/0084711 A1* | 4/2010 | Kim | ............... H01L 29/0847 257/355 |
| 2010/0237390 A1 | 9/2010 | Kenichi | |
| 2013/0162874 A1 | 6/2013 | Hashimoto et al. | |
| 2013/0183786 A1 | 7/2013 | Itahashi et al. | |
| 2013/0194473 A1 | 8/2013 | Tsuchiya | |

FOREIGN PATENT DOCUMENTS

| | | |
|---|---|---|
| JP | 2006-245522 | 9/2006 |
| JP | 2007-336306 | 12/2007 |
| JP | 2010-219355 | 9/2010 |
| JP | 2012-009652 | 1/2012 |
| JP | 2012-080252 | 4/2012 |
| JP | 2013-145853 | 7/2013 |
| JP | 2013-157534 | 8/2013 |

* cited by examiner

[Fig. 1]
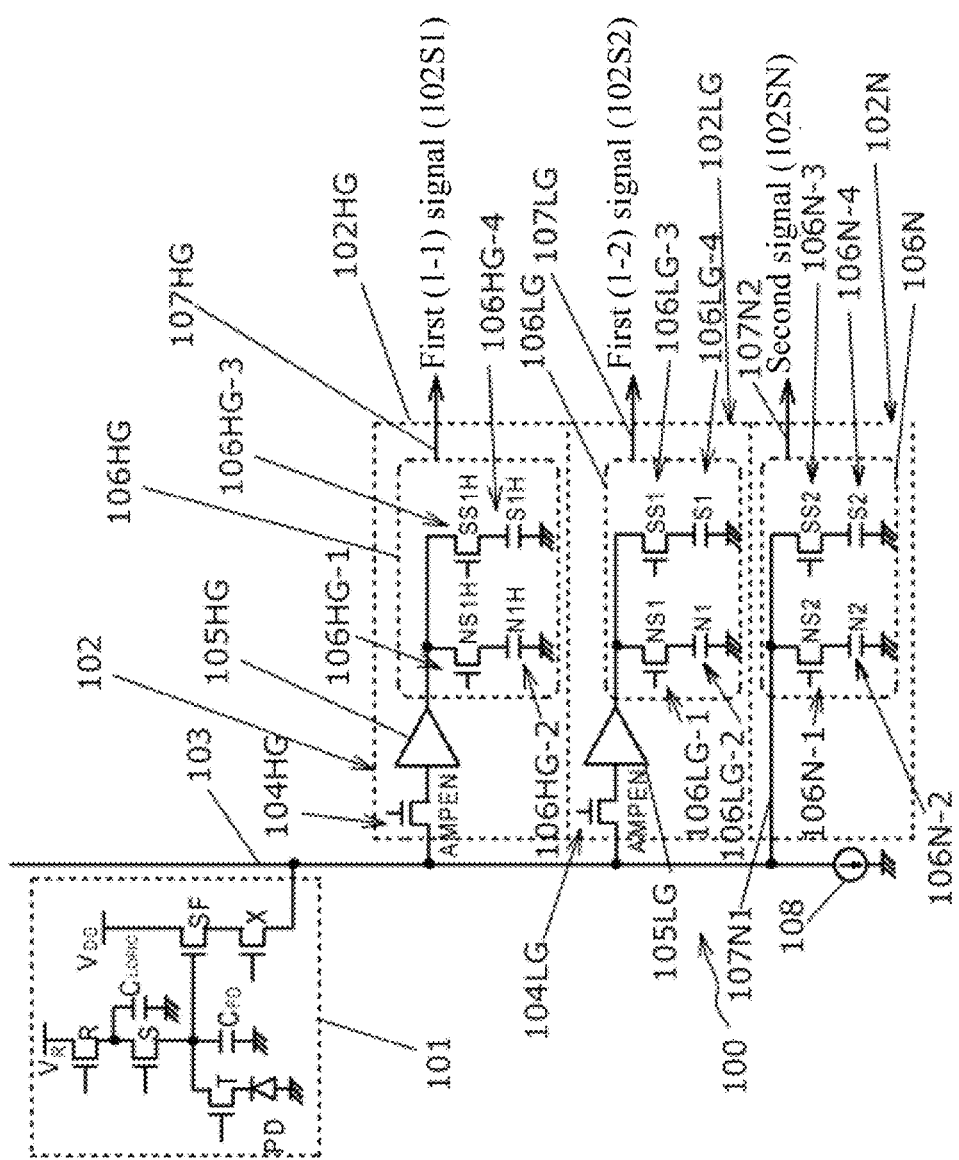

[Fig. 2]
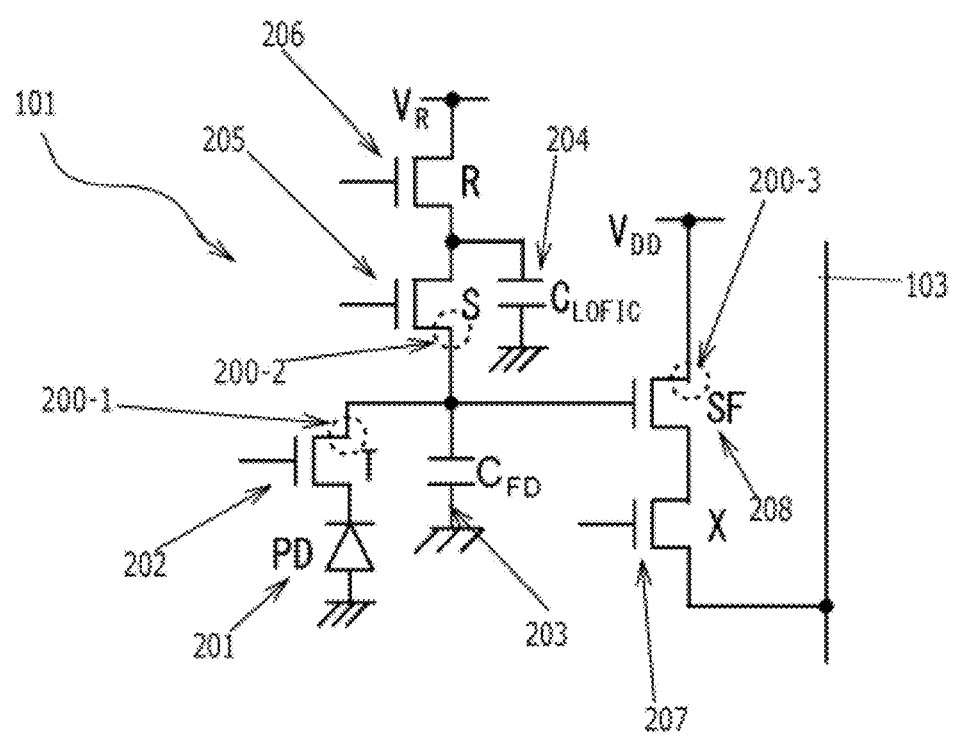

[Fig. 3A]
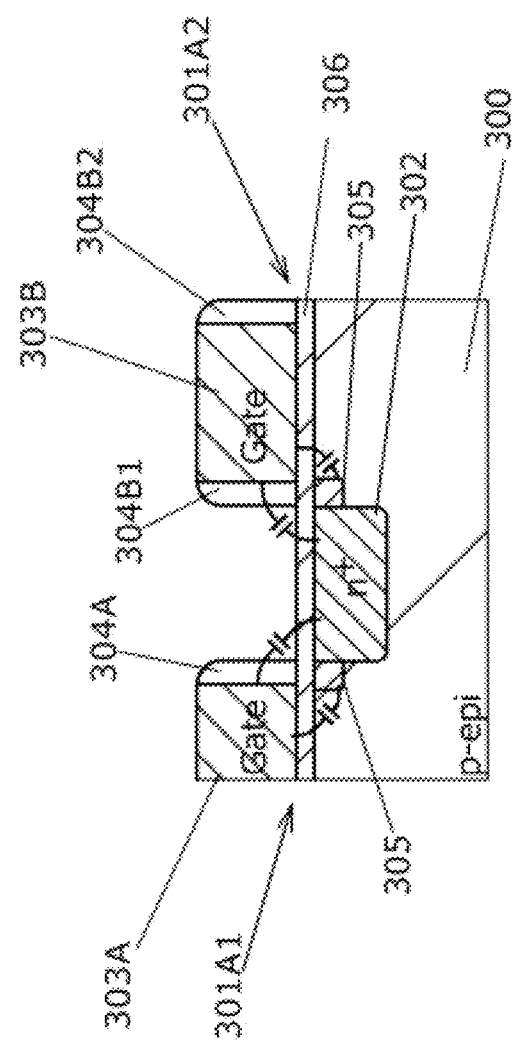

[Fig. 3B]
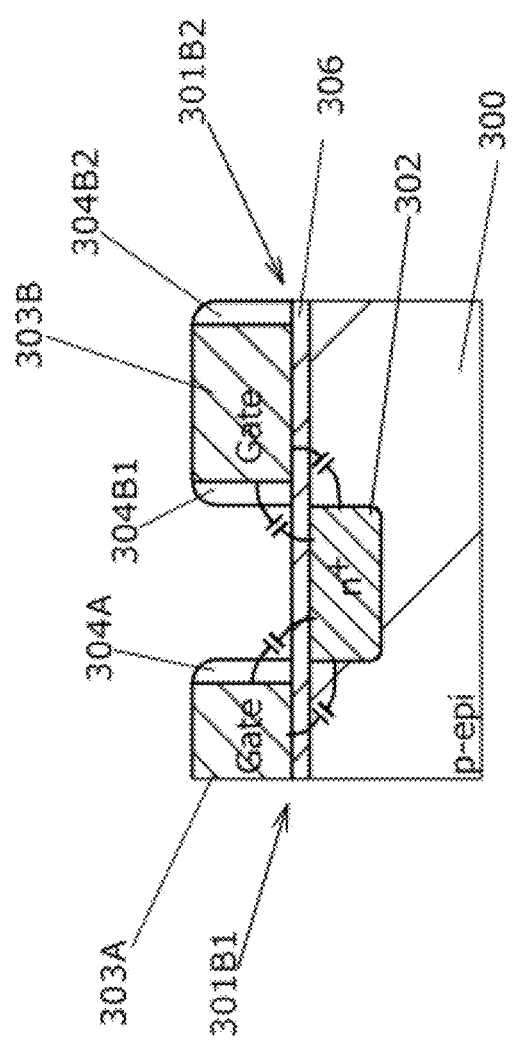

[Fig. 4A]
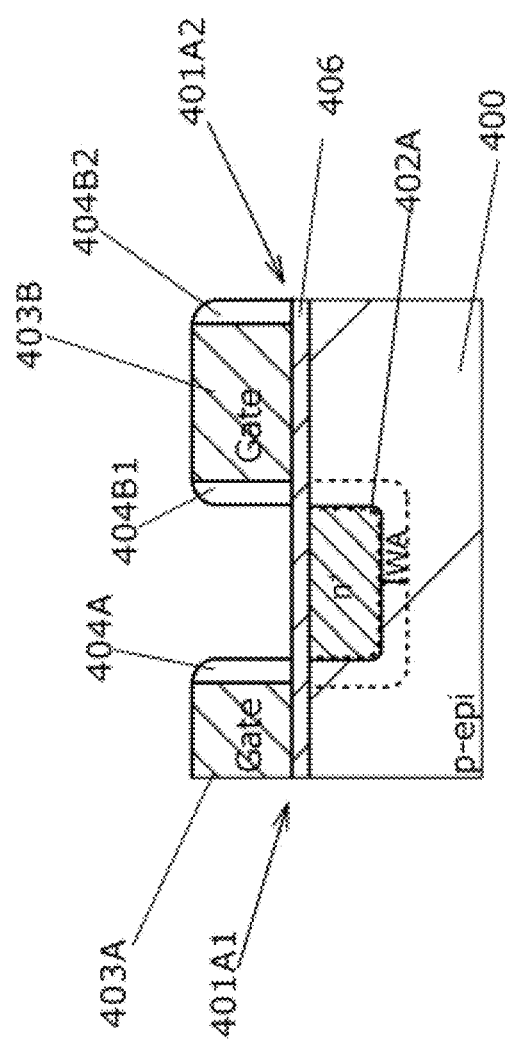

[Fig. 4B]
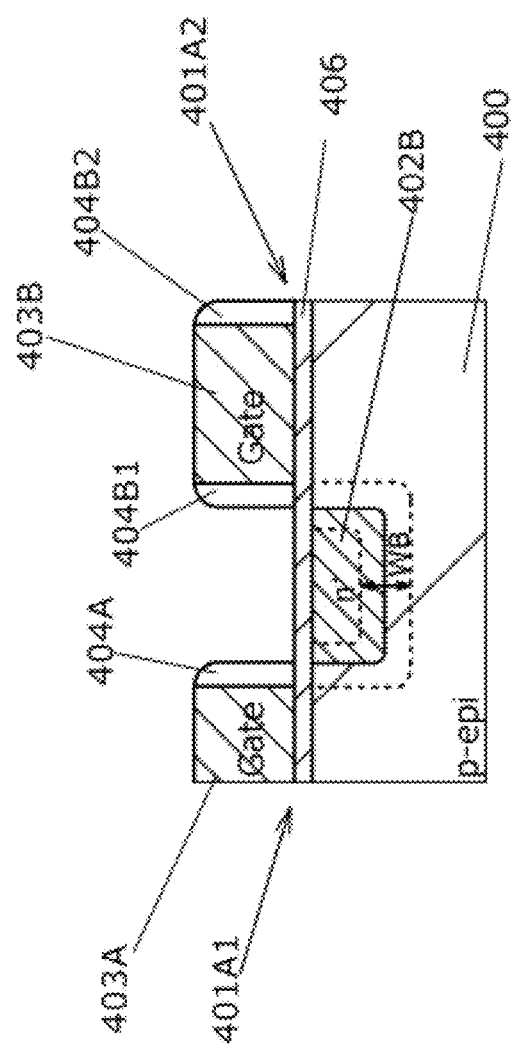

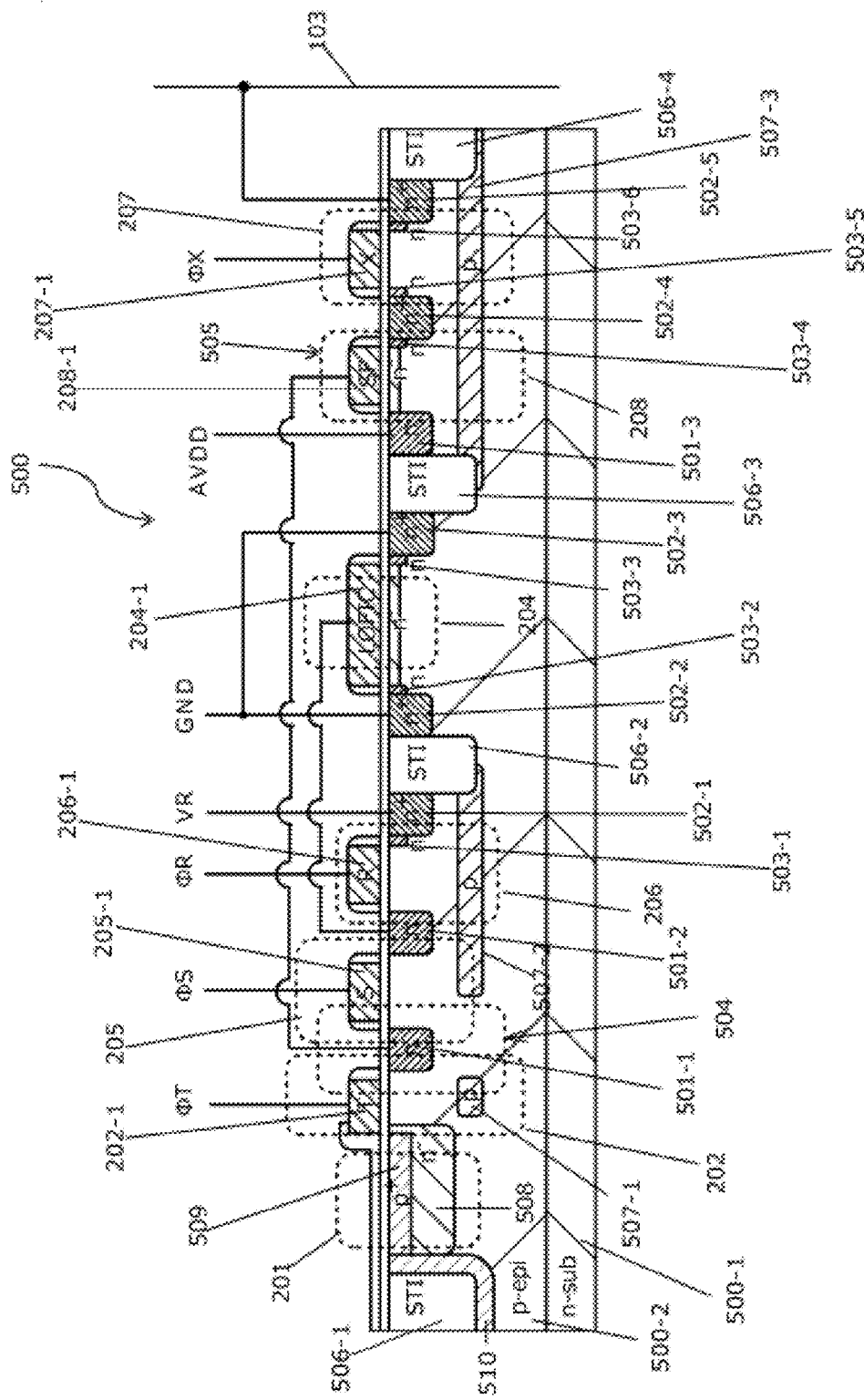
[Fig. 5]

[Fig. 6A]
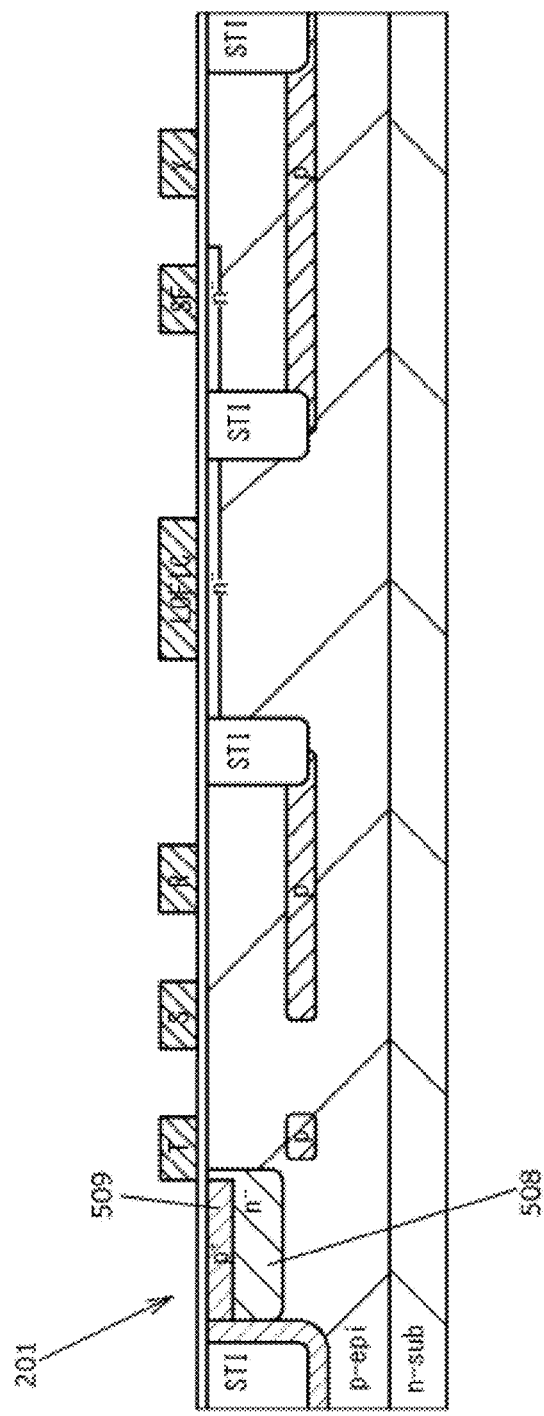

[Fig. 6B]
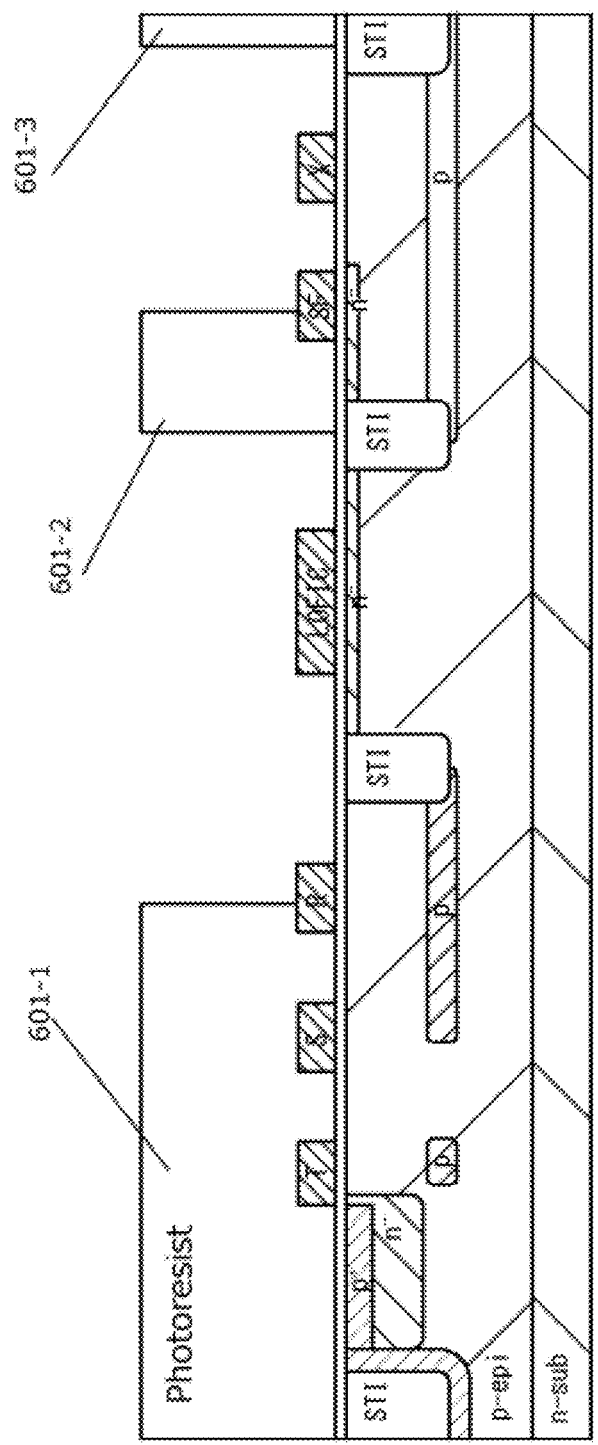

[Fig. 6C]
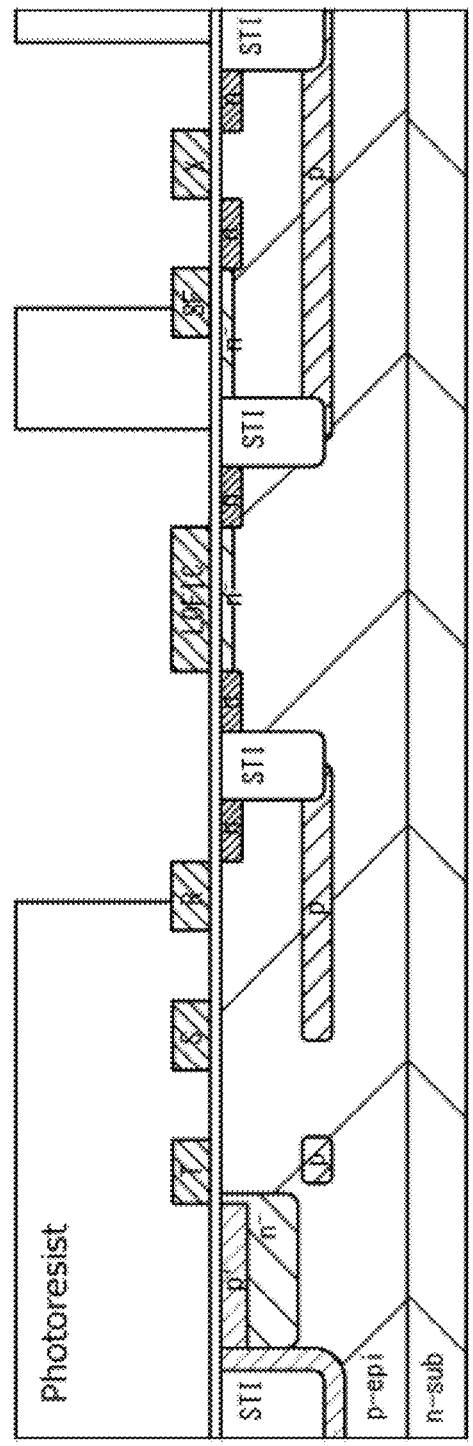

[Fig. 6D]
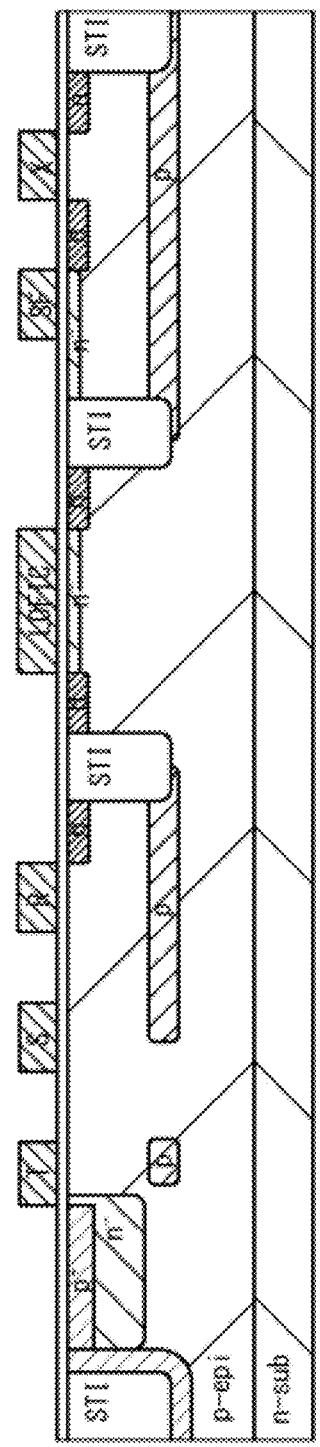

[Fig. 6E]
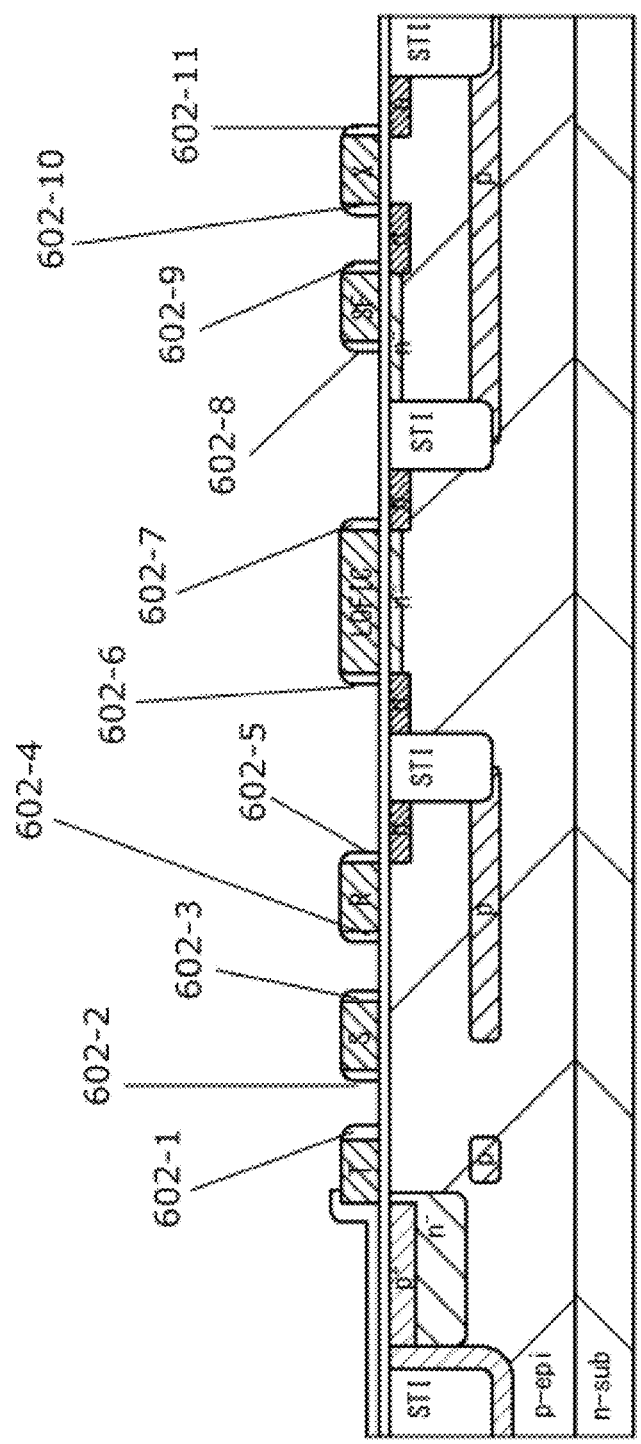

[Fig. 6F]
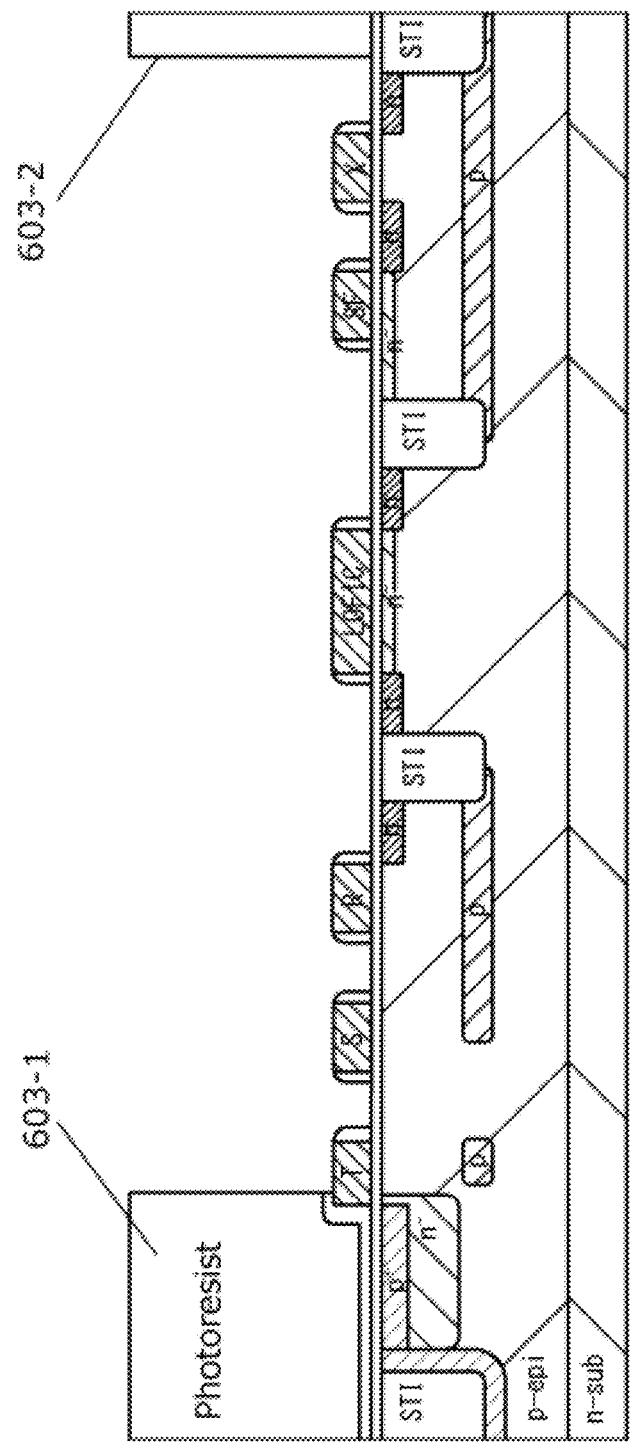

[Fig. 6G]
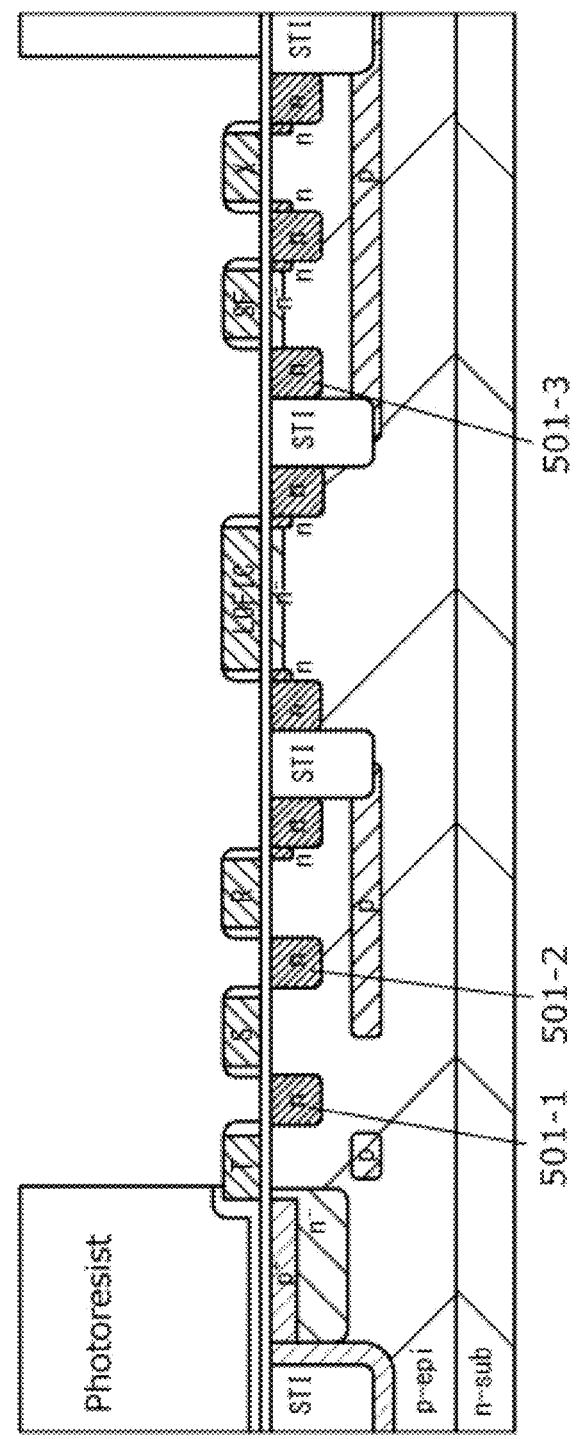

[Fig. 6H]
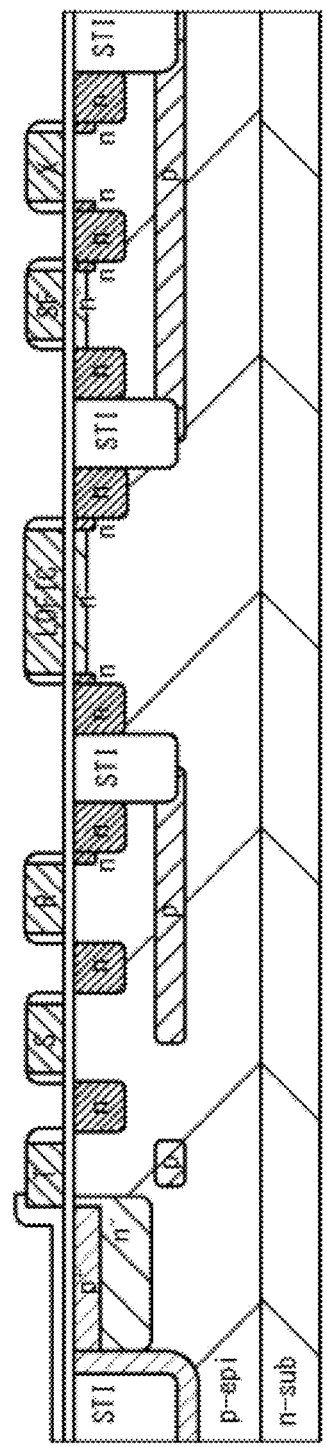

[Fig. 6I]
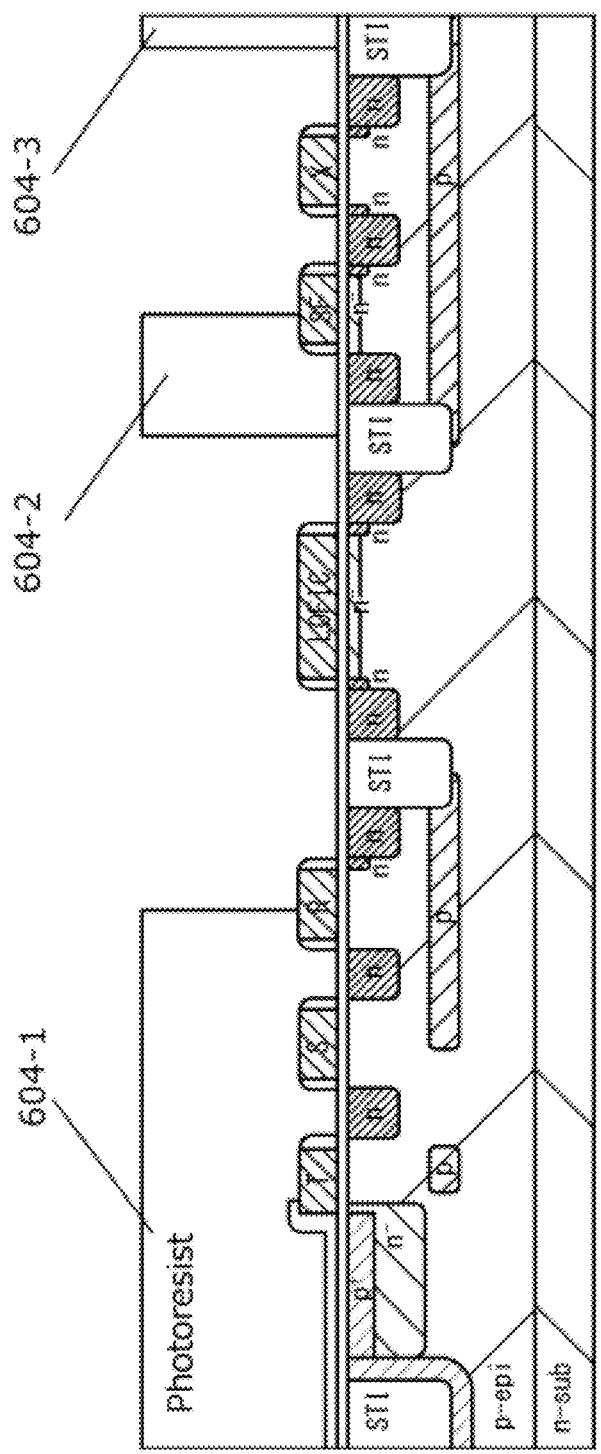

[Fig. 6J]
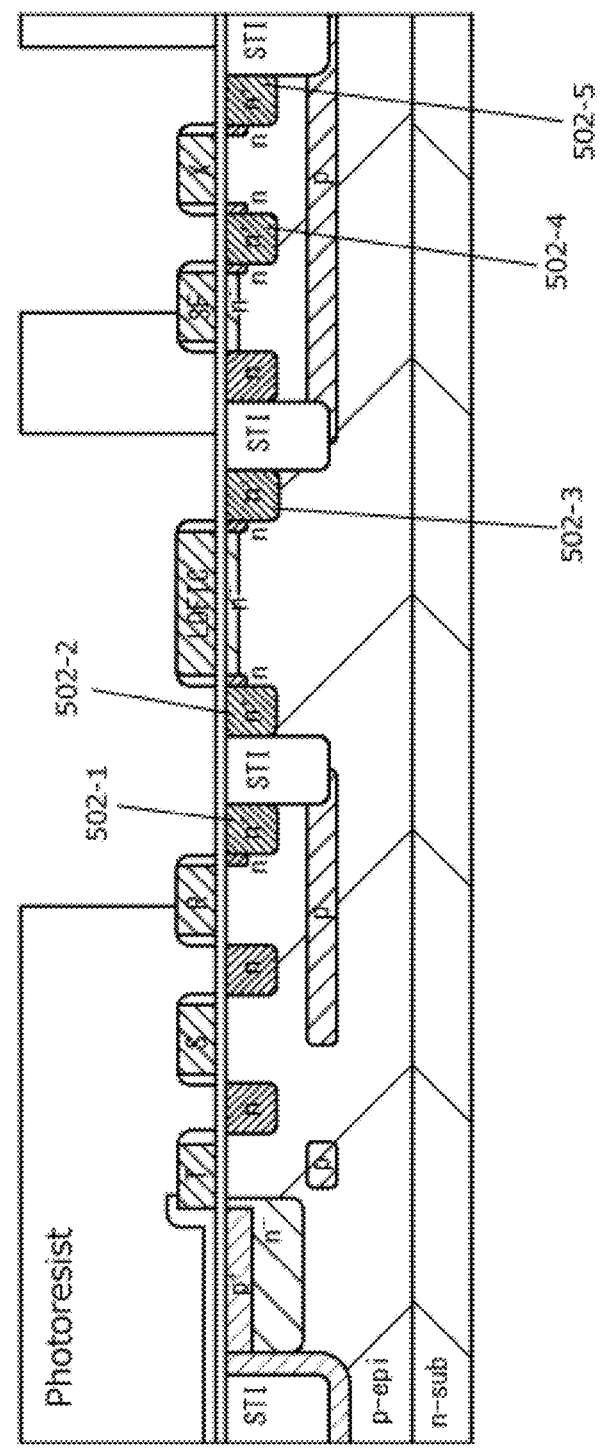

[Fig. 6K]
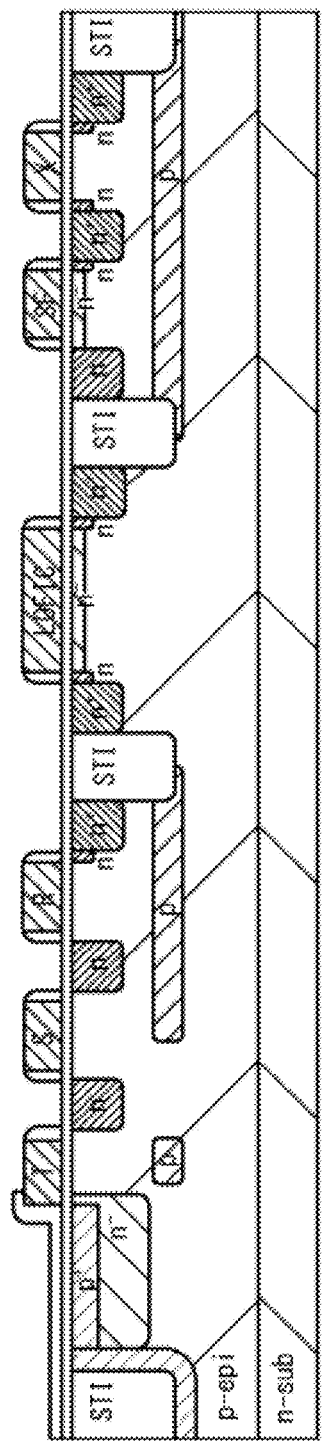

[Fig. 6L]
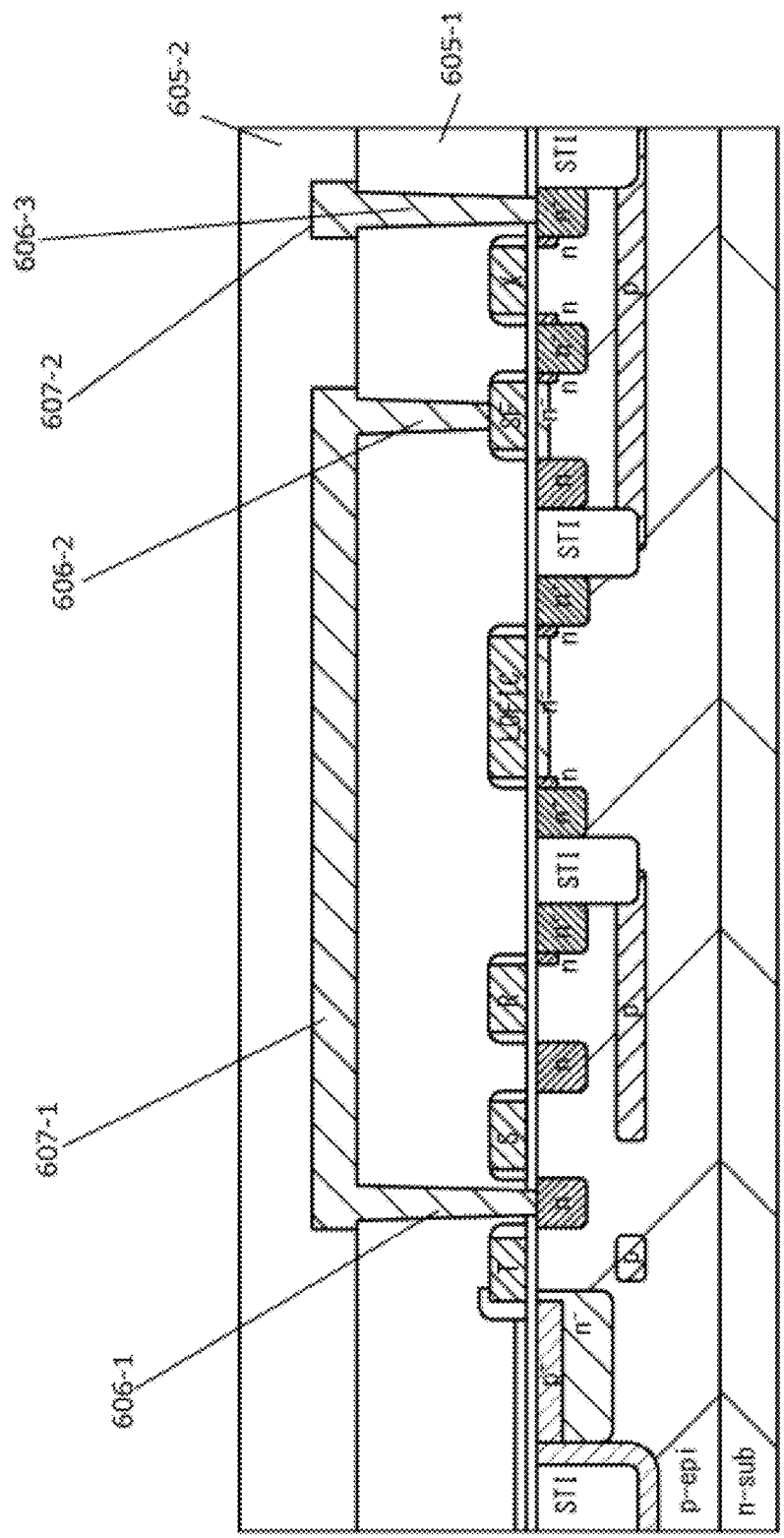

[Fig. 7]
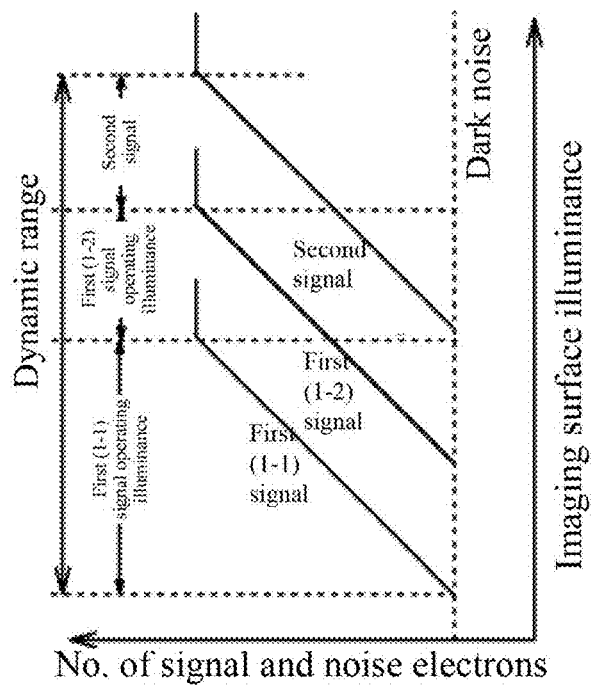

[Fig. 8]
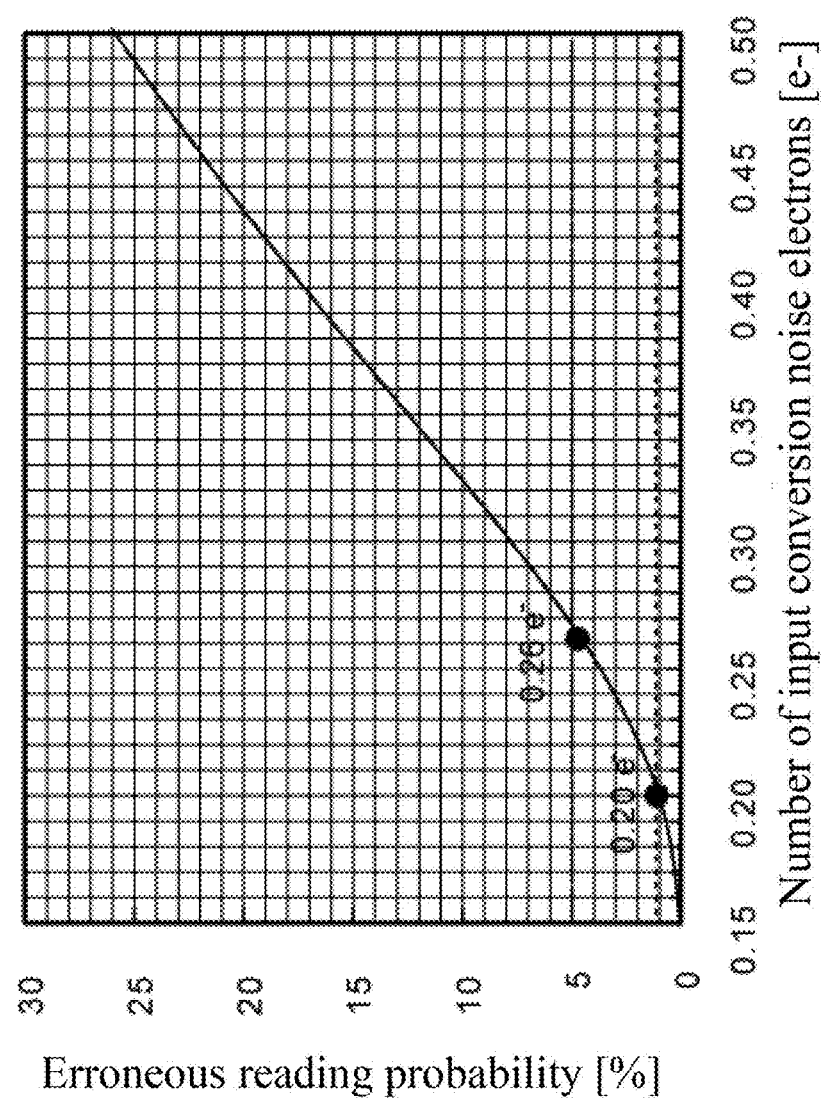

[Fig. 9]
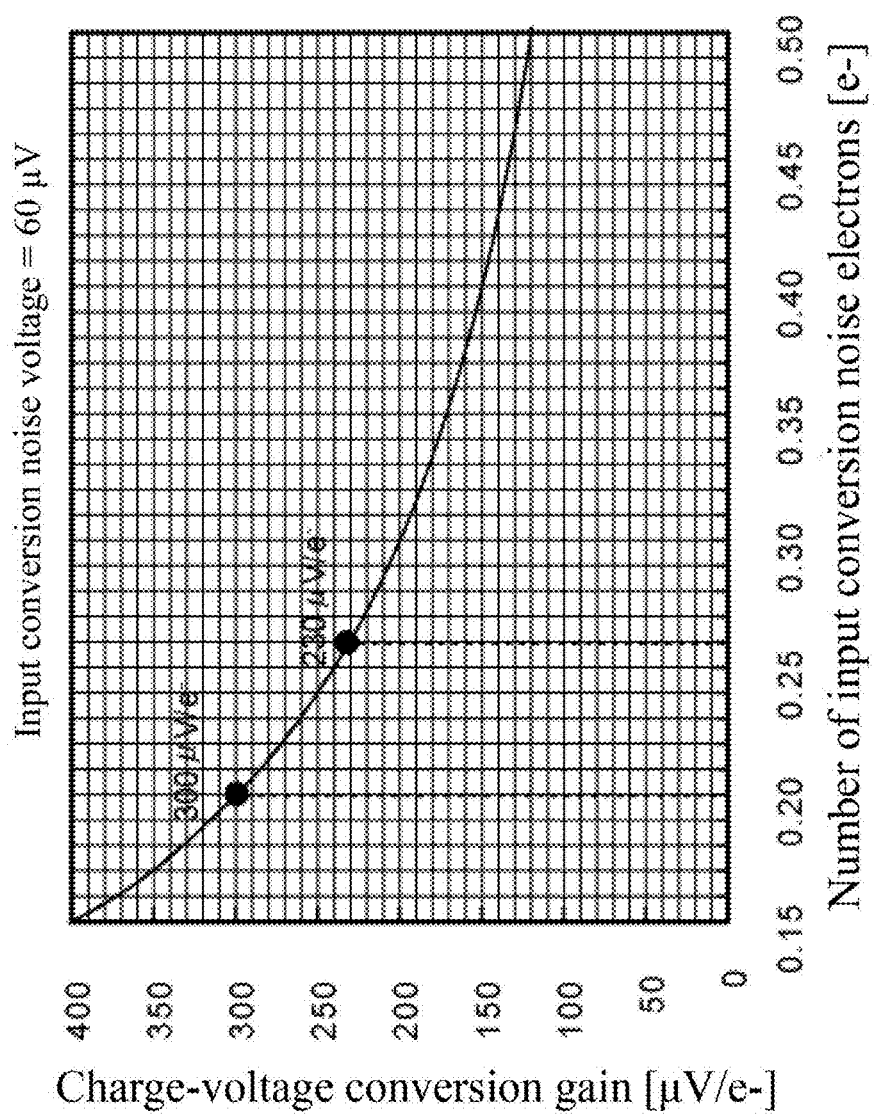

[Fig. 10]
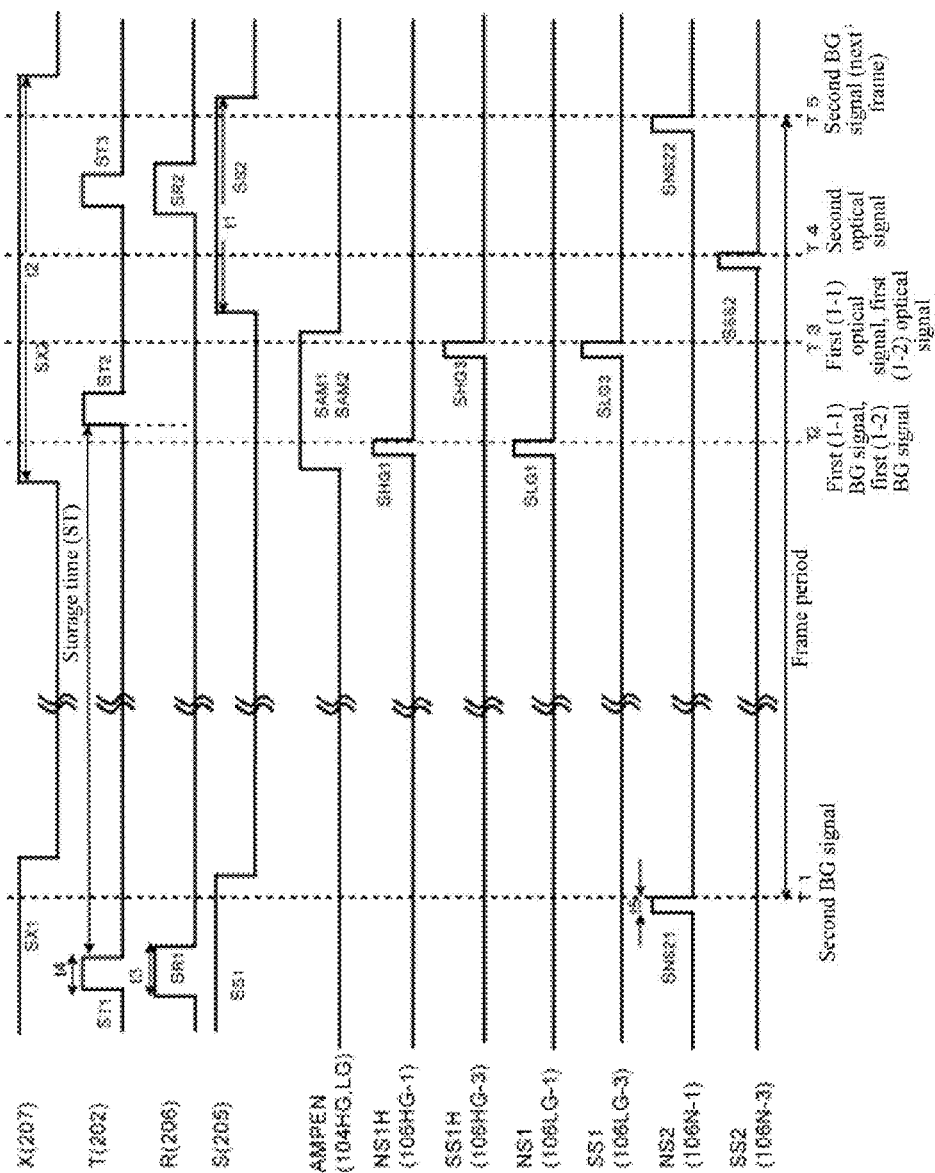

[Fig. 11]
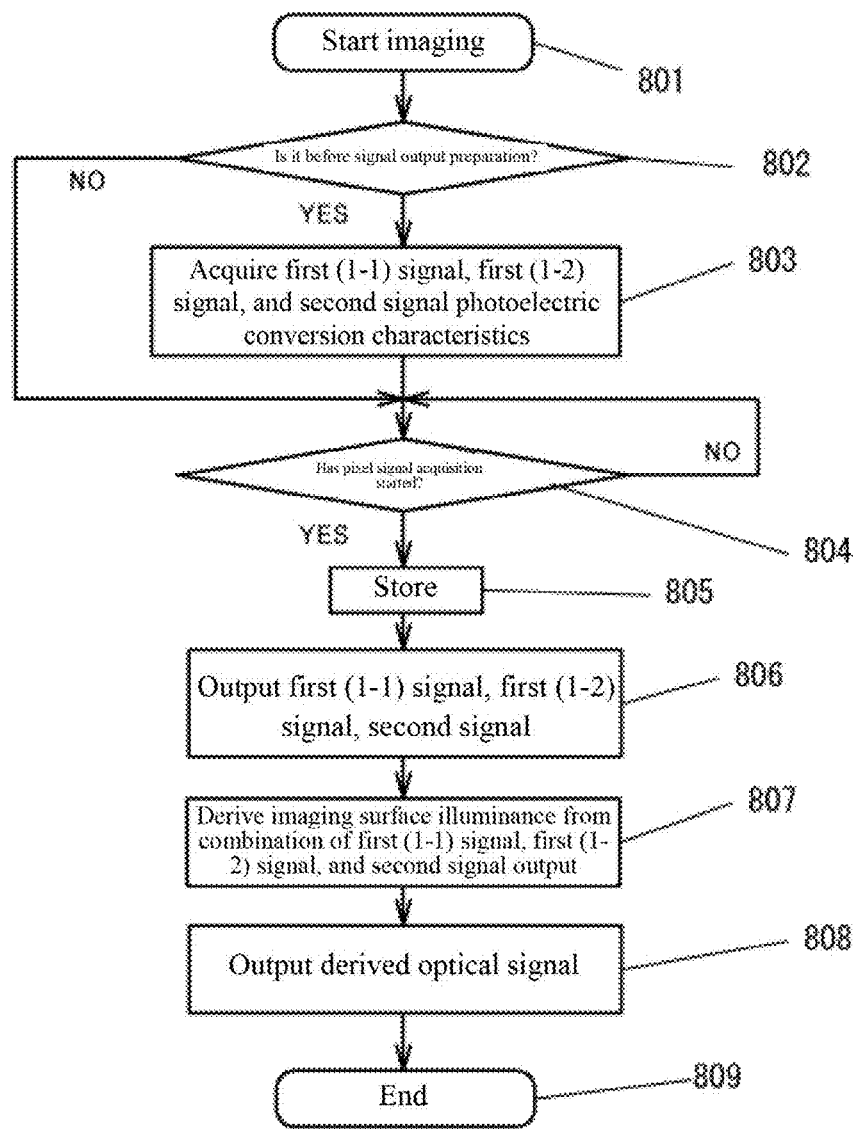

[Fig. 12]
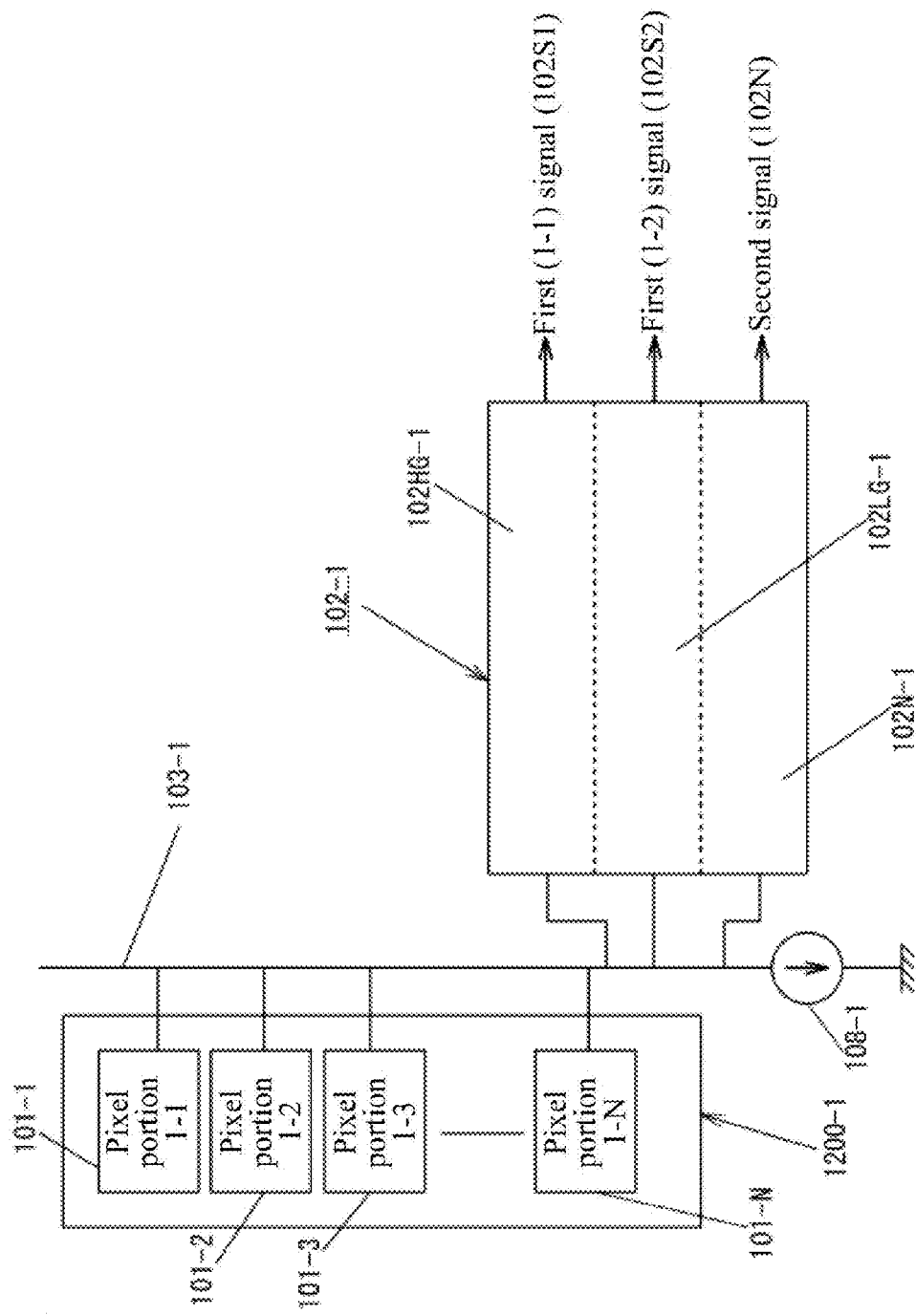

[Fig. 13]
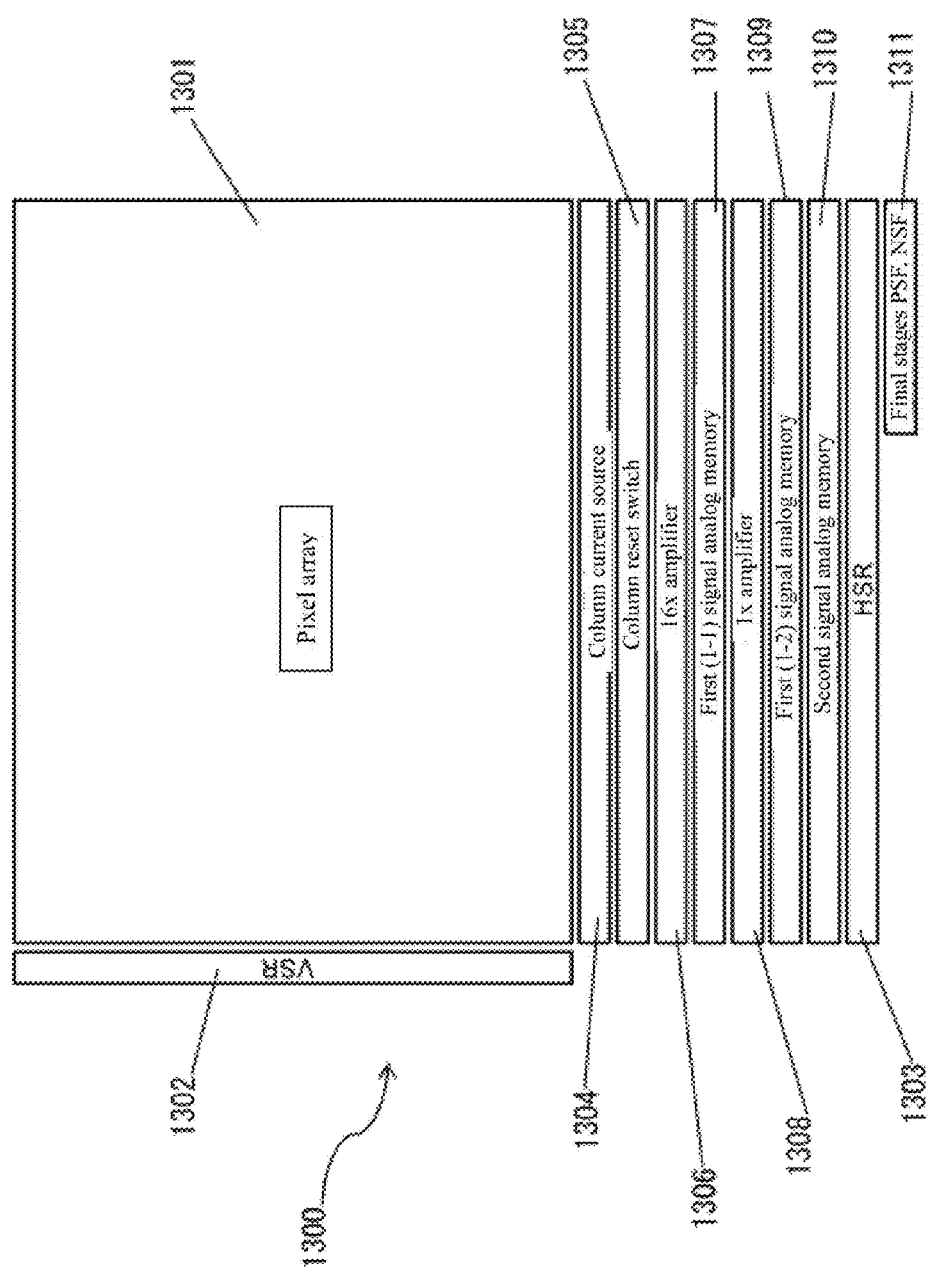

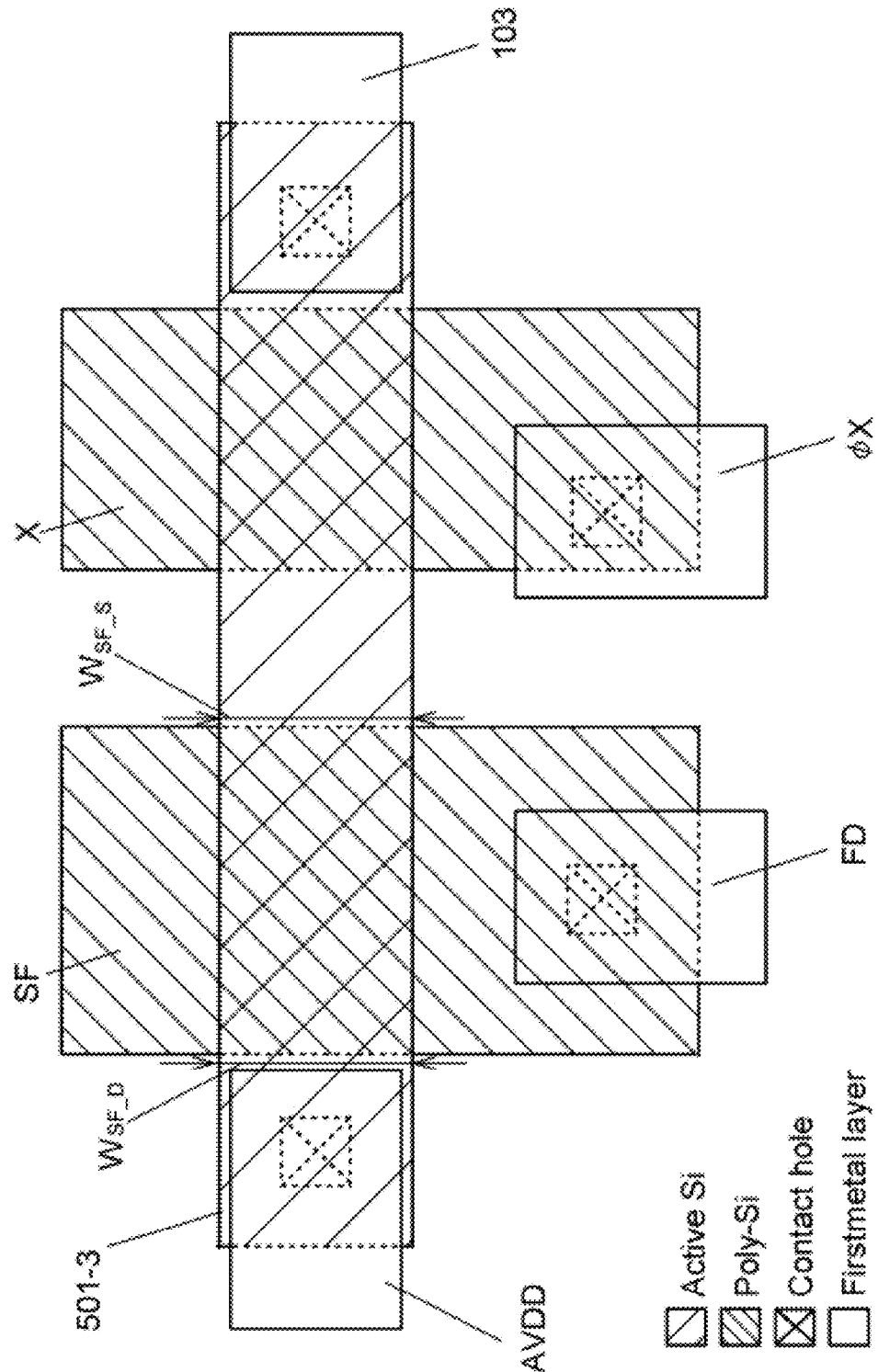
[Fig. 14]

[Fig. 15]
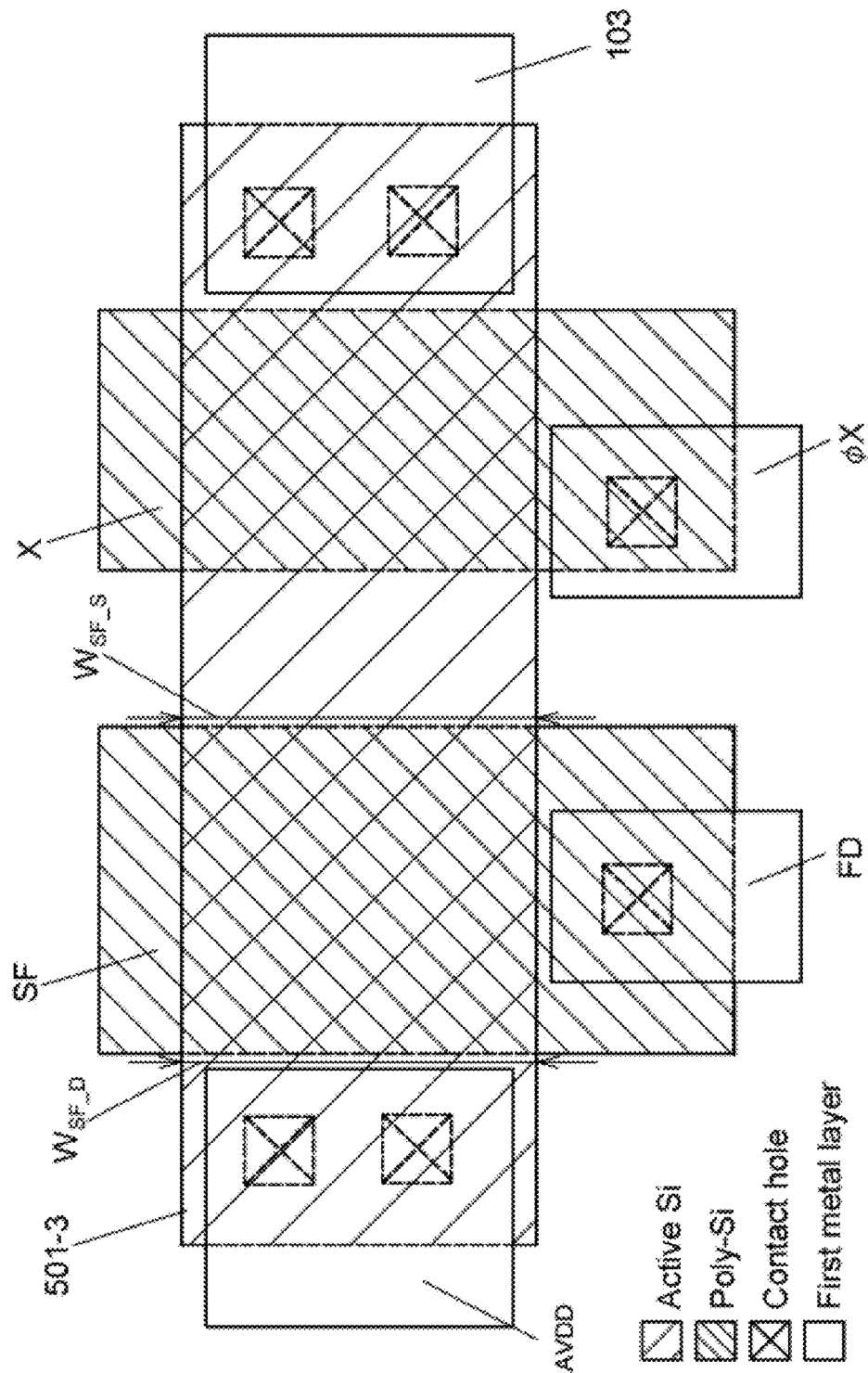

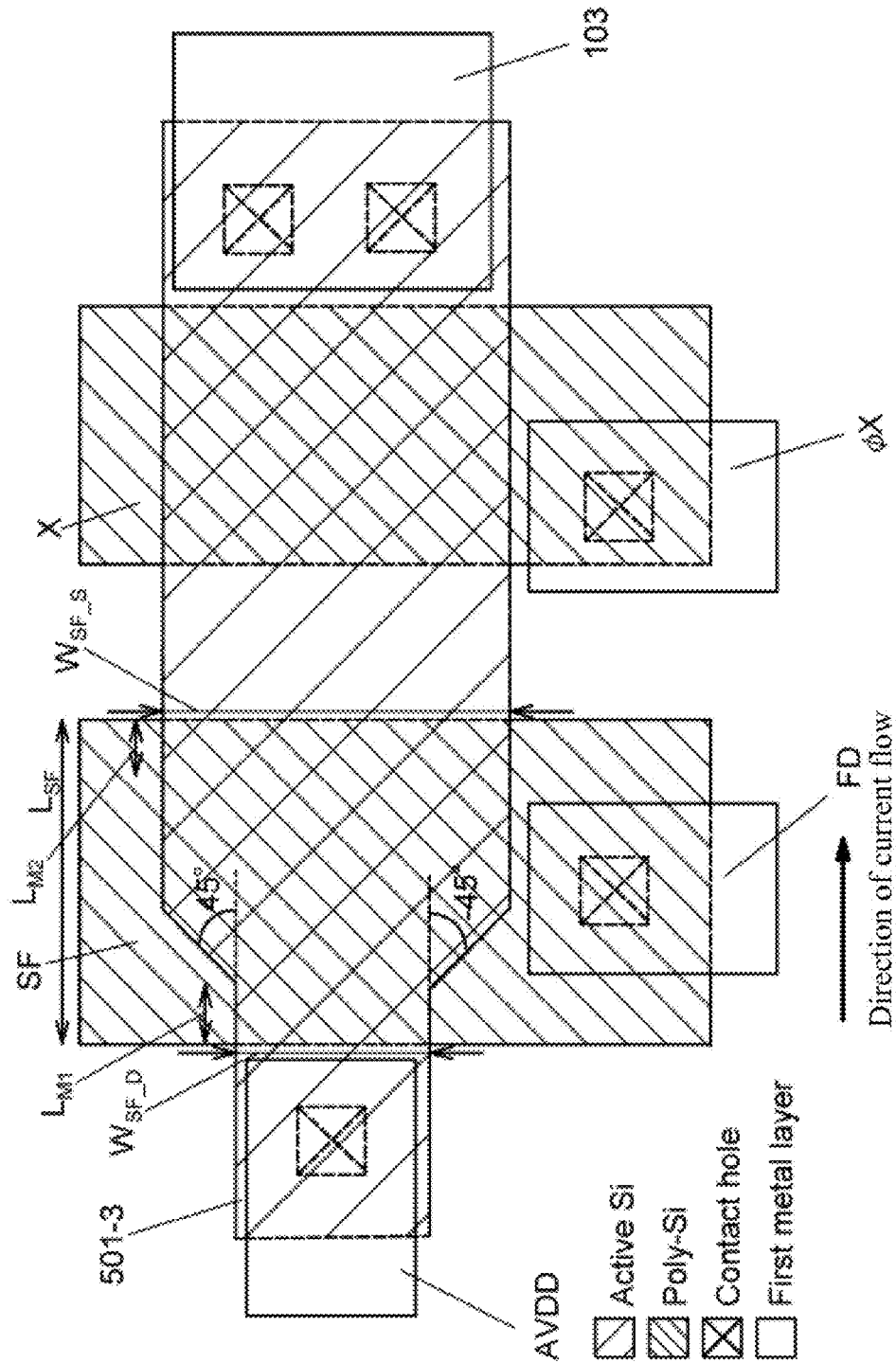
[Fig. 16]

OPTICAL SENSOR AND SOLID-STATE IMAGING DEVICE, AND SIGNAL READING METHODS THEREFOR

This application is a national phase of PCT Application No. PCT/JP2015/082089 filed Nov. 16, 2015, which in turn claims benefit of Japanese Patent Application No. 2014-233172 filed Nov. 17, 2014.

BACKGROUND OF THE INVENTION

Field of the Invention

The present invention relates to an optical sensor, a signal reading method therefor, a solid-state imaging device, and a signal reading method therefor.

Description of the Background Art

With advancements in science and technology as well as the widespread availability of the Internet, demands for optical sensors and solid-state imaging devices have expanded dramatically. Meanwhile, optical sensors having high sensitivity, high speed, wide dynamic range, and broad optical wavelength band compatibility as well as still image and video compatible solid-state imaging devices are in strong demand in the market as must-haves for the development of new markets. In particular, optical sensors having a wider dynamic range and solid-state imaging devices are desired in markets such as medical, pharmaceutical, health, and nursing markets, life science markets, and disaster prevention and crime prevention markets required for the formation of a safe and secure society.

Examples of optical sensors having a wide dynamic range and solid-state imaging devices include those described in Patent Document 1.

PATENT DOCUMENTS

Patent Document 1: Japanese Laid-Open Patent Application No. 2005-328493

SUMMARY OF THE INVENTION

Problems to be Solved by the Invention

Nevertheless, while the optical sensor and the solid-state imaging device described in Patent Document 1 certainly have a wide dynamic range compared to conventional products, the widened area of the dynamic range is on the high illumination side while the low illumination side remains in the conventional realm. Thus, markets that also require support in the low light intensity range remain underserved. As a result, further industry development and the realization of a safer and more secure society are still significant issues in the international community.

The present invention has been made in view of the above, and it is therefore a main object of the present invention to provide an optical sensor, a solid-state imaging device, and methods for reading the signals therefrom, which contribute greatly to the development of industry and the realization of a safer and more secure society.

It is another object of the present invention to provide an optical sensor having a wide dynamic range performance that allows detection from a single photon, a solid-state imaging device, and methods for reading the signals therefrom.

It is yet another object of the present invention to provide an optical sensor having a dynamic range, from a single-photon light intensity range to a high illumination light intensity range, as well as high sensitivity, high speed, and broad optical wavelength band compatibility, a solid-state imaging device, and methods for reading the signals therefrom.

It is yet another object of the present invention to provide an optical sensor having a wide dynamic range performance that achieves both a high sensitivity performance and an adequate high saturation performance that allow single photon detection, as well as high sensitivity, high speed, and broad optical wavelength band compatibility, a solid-state imaging device, and methods for reading the signals therefrom.

Means for Solving the Problems

The present invention is the result of extensive efforts in research and development in view of the above, and one aspect of the present invention is an optical sensor comprising a light-receiving element, storage capacitors that store a charge, and a transfer switch for transferring to the storage capacitors a charge generated by light input to the light-receiving element, wherein the storage capacitors are a floating diffusion capacitor and a lateral overflow integration capacitor, and the transfer switch is a non-LDD/MOS transistor for which the impurity concentration of a drain region thereof is $1\times10^2$ impurities/cm$^3$ or less.

Another aspect of the present invention is an optical sensor comprising a light-receiving element (PD), a transfer switch (T), an overflow switch (S), and a reset switch (R) connected in series in that order;

a floating diffusion capacitor (CD) and a source follower switch (SF) connected to wiring between the transfer switch (T) and the switch (S); and a lateral overflow integration capacitor ($C_{LOFIC}$) connected to wiring between the switch (S) and the reset switch (R); wherein the source follower switch (SF) is a MOS transistor, and the transfer switch (T) is a non-LDD/MOS transistor for which the impurity concentration of a drain region is 50% less than an impurity concentration of a source region of the source follower switch (SF).

Yet another aspect of the present invention is an optical sensor comprising a light-receiving element, storage capacitors that store a charge, a transfer switch for transferring to the storage capacitors a charge generated by light input to the light-receiving element, and a pixel signal output line per pixel; and a signal reading path connected to the pixel signal output lines; wherein:

the storage capacitors are a floating diffusion capacitor and a lateral overflow integration capacitor, and the transfer switch is a non-LDD/MOS transistor for which the impurity concentration of a drain region thereof is $1\times10^{20}$ impurities/cm$^3$ or less;

the signal reading path receives a first pixel output signal subjected to charge-voltage conversion by the floating diffusion capacitor, and a second pixel output signal subjected to charge-voltage conversion by combining the floating diffusion capacitor and the lateral overflow integration capacitor; and the first pixel output signal is amplified in the signal reading path by a plurality of amplifiers that include at least one amplifier having an amplification factor greater than 1.

Yet another aspect of the present invention is a multi-pixel optical sensor comprising a light-receiving element, storage capacitors that store a charge, and a transfer switch for transferring to the storage capacitors a charge generated by light input to the light-receiving element, the storage capacitors being a floating diffusion capacitor and a lateral overflow integration capacitor, and the transfer switch being a non-LDD/MOS transistor for which an impurity concentration of a drain region thereof is $1 \times 10^{20}$ impurities/cm$^3$ or less;

pixel column portions having pixel portions planarly arranged therein;

a pixel signal output line having the pixel column portions connected sequentially thereto; and a signal reading path portion connected to the pixel signal output at a position downstream from a position where a last pixel portion of an array of the pixel column portions of the pixel signal output line is connected; wherein:

the signal reading path portion comprises a plurality of signal paths, and at least two of the plurality of signal paths are respectively provided with amplification functions having different amplification factors; and at least one of the amplification functions has an amplification factor greater than 1.

Yet another aspect of the present invention is a signal reading method for an optical sensor comprising a light-receiving element, storage capacitors that store a charge, and a transfer switch for transferring to the storage capacitors a charge generated by light input to the light-receiving element, per pixel portion;

a sensor portion in which the storage capacitors are a floating diffusion capacitor and a lateral overflow integration capacitor, and the transfer switch is a non-LDD/MOS transistor for which the impurity concentration of a drain region thereof is $1 \times 10^{20}$ impurities/cm$^3$ or less;

a pixel signal output line having each pixel portion connected thereto; and a signal reading path connected to the pixel signal output line;

the signal reading method comprising the steps of:

forming a first pixel output signal by converting a charge of a charge amount that contributes to reading by the floating diffusion capacitor to voltage, forming a second pixel output signal by combining the floating diffusion capacitor and the lateral overflow integration capacitor and converting a charge of a charge amount that contributes to reading to voltage, and inputting these two pixel output signals to the signal reading path; wherein:

the first pixel output signal is amplified in the signal reading path by a plurality of amplifiers that include at least one amplifier having an amplification factor greater than 1.

Yet another aspect of the present invention is an imaging device comprising a light-receiving element (PD), a transfer switch (T), an overflow switch (S), and a reset switch (R) connected in series in that order, a floating diffusion capacitor ($C_{FD}$) and a source follower switch (SF) connected to wiring between the transfer switch (T) and the switch (S), and a lateral overflow integration capacitor ($C_{LOFIC}$) connected to wiring between the switch (S) and the reset switch (R), wherein:

the source follower switch (SF) is a MOS transistor;

the transfer switch (T) comprises a plurality of pixel portions serving as non-LDD/MOS transistors for which the impurity concentration of a drain region is 50% less than an impurity concentration of a source region of the source follower switch (SF), and the light-receiving elements (PD) of the plurality of pixel portions are arranged two-dimensionally and comprise a pixel array;

the plurality of pixel portions comprises pixel column output signal lines that are sequentially connected;

the pixel column output signal line comprises a column circuit portion connected thereto, and the column circuit portion receives a first pixel output signal subjected to charge-voltage conversion by the floating diffusion capacitor, and a second pixel output signal subjected to charge-voltage conversion by combining the floating diffusion capacitor and the lateral overflow integration capacitor; and the first pixel output signal is amplified in the signal reading path by a plurality of amplifiers that include at least one amplifier having an amplification factor greater than 1.

Yet another aspect of the present invention is a signal reading method for an imaging device comprising a light-receiving element (PD), a transfer switch (T), an overflow switch (S), and a reset switch (R) connected in series in that order, a floating diffusion capacitor ($C_{FD}$) and a source follower switch (SF) connected to wiring between the transfer switch (T) and the switch (S), and a lateral overflow integration capacitor ($C_{LOFIC}$) connected to wiring between the switch (S) and the reset switch (R), wherein:

the source follower switch (SF) is a MOS transistor, the transfer switch (T) comprises a plurality of pixel portions serving as non-LDD/MOS transistors for which the impurity concentration of a drain region is 50% less than an impurity concentration of a source region of the source follower switch (SF), the light-receiving elements (PD) of the plurality of pixel portions are arranged two-dimensionally to constitute a pixel array, the plurality of pixel portions is sequentially connected to a pixel column output signal line, and the pixel column output signal line is connected to a column circuit portion;

the signal reading method comprising the steps of:

forming a first pixel output signal by converting a charge of a charge amount that contributes to reading by the floating diffusion capacitor to voltage, forming a second pixel output signal by combining the floating diffusion capacitor and the lateral overflow integration capacitor and converting a charge of a charge amount that contributes to reading to voltage, and inputting these two pixel output signals to the signal reading path; wherein:

the first pixel output signal is amplified in the signal reading path by a plurality of amplifiers that include at least one amplifier having an amplification factor greater than 1.

Effect of the Invention

According to the present invention, it is possible to provide an optical sensor having a wide dynamic range performance, from a single photon light intensity range to a high illumination light intensity range, as well as high sensitivity, high speed, and broad optical wavelength band compatibility, a solid-state imaging device, and driving methods thereof, making it possible to contribute greatly to the development of industry and the realization of a safer and more secure society.

BRIEF DESCRIPTION OF THE DRAWINGS

FIG. 1 is a circuit diagram illustrating an example of preferred embodiment of a pixel circuit and one column of reading circuits of a CMOS image sensor according to the present invention.

FIG. 2 is an equivalent circuit diagram illustrating a pixel circuit portion extracted from the circuit diagram illustrated in FIG. 1.

FIG. 3A is a schematic structural cross-sectional view for explaining a normal structure of a MOS transistor.

FIG. 3B is a schematic structural cross-sectional view for explaining a structure of a MOS transistor according to the present invention.

FIG. 4A is a schematic structural cross-sectional view schematically illustrating an expanse of a width W of a depletion layer formed when a diffusion layer having a normal impurity concentration is provided.

FIG. 4B is a schematic structural cross-sectional view schematically illustrating the expanse of the width W of the depletion layer formed when a diffusion layer having an impurity concentration reduced to a value lower than normal is provided as in the present invention.

FIG. 5 is a schematic modification cross-sectional view for explaining a device structure layout when LDD formation is omitted and a concentration reduction of the diffusion layer is applied to a device comprising a pixel circuit portion 101 illustrated in FIG. 2.

FIG. 6A is a schematic step diagram for explaining a manufacturing example of an optical input sensor pixel portion 500.

FIG. 6B is a schematic step diagram following FIG. 6A.
FIG. 6C is a schematic step diagram following FIG. 6B.
FIG. 6D is a schematic step diagram following FIG. 6C.
FIG. 6E is a schematic step diagram following FIG. 6D.
FIG. 6F is a schematic step diagram following FIG. 6E.
FIG. 6G is a schematic step diagram following FIG. 6F.
FIG. 6H is a schematic step diagram following FIG. 6H.
FIG. 6I is a schematic step diagram following FIG. 6H.
FIG. 6J is a schematic step diagram following FIG. 6.
FIG. 6K is a schematic step diagram following FIG. 6K.
FIG. 6L is a schematic step diagram following FIG. 6K.

FIG. 7 is a schematic explanatory conceptual view for explaining photoelectric conversion characteristics of a first (1-1) signal, a first (1-2) signal, and a second signal.

FIG. 8 is a graph showing the relationship between a number of noise electrons of floating diffusion input conversion and an erroneous reading probability.

FIG. 9 is a graph showing the relationship between the number of input conversion noise electrons and a charge-voltage conversion gain.

FIG. 10 is a timing diagram when a signal of one pixel is read.

FIG. 11 is a flowchart for explaining a procedure when a signal of one pixel is read.

FIG. 12 illustrates an example of a preferred embodiment of a sensor portion in a case where the CMOS image sensor according to the present invention is applied to an imaging device, and is a circuit diagram illustrating N pixel circuits of a first column and one column of reading circuits.

FIG. 13 is an overall block diagram schematically illustrating the entire sensor portion of the imaging device illustrated in FIG. 12.

FIG. 14 is a diagram illustrating an example of a schematic layout pattern of pixel selection switch means (X) 207 and source follower switch means (SF) 208.

FIG. 15 is a diagram illustrating another example of a schematic layout pattern of the pixel selection switch means (X) 207 and the source follower switch means (SF) 208.

FIG. 16 is a diagram illustrating yet another example of a schematic layout pattern of the pixel selection switch means (X) 207 and the source follower switch means (SF) 208.

DESCRIPTION OF THE PREFERRED EMBODIMENTS

FIG. 1 illustrates a circuit diagram serving as an example of a preferred embodiment (embodiment 1) illustrating a pixel circuit and one column of reading circuits of a CMOS optical input sensor according to the present invention.

With the circuit configuration in FIG. 1 and a device structure described later, it is possible to achieve both high sensitivity and high saturation for photon detection.

To avoid complexities in illustration and explanation, FIG. 1 illustrates the minimum parts required for a bare minimum explanation that will allow the aspects of the present invention to be plainly understood.

A circuit 100 in FIG. 1 comprises a pixel circuit portion 101 and a column circuit portion 102.

The pixel circuit portion 101 and the column circuit portion 102 are electrically connected via a pixel column output signal line 103. A current source 108 is provided below the pixel column output signal line 103. The current source 108 comprises a MOS transistor, for example.

The equivalent circuit diagram of the pixel circuit portion 101 is equivalent to the pixel equivalent circuit diagram in FIG. 21 of Patent Document 1. In the example in FIG. 1, the column circuit portion 102 comprises three column reading circuits. A first column reading circuit 102HG for outputting a first (1-1) signal 102S1 is configured by arranging switch means (SW/AMPEN) 104HG, a high-gain amplifier 105HG, and an analog memory circuit portion 106HG for reading the first (1-1) signal 102S1, in that order from the upstream side, and electrically connecting the same using a signal line 107HG.

In the analog memory circuit portion 106HG, switch means (NS1H) 106HG-1 and a capacitor (N1H) 106HG-2 as well as switch means (SS1H) 106HG-3 and a capacitor (S1H) 106HG-4 for the first (1-1) signal 102S1 are respectively electrically connected in series, and connected as illustrated to the signal line 107HG.

A second column reading circuit 102LG for outputting a first (1-2) signal 10252 is configured by arranging switch means (SW/AMPEN) 104LG, a low-gain amplifier 10SLG, and an analog memory circuit portion 106LG for reading the first (1-2) signal 102S2, in that order from the upstream side, and electrically connecting the same using a signal line 107LG.

In the analog memory circuit portion 106LG, switch means (NS1) 106LG-1 and a capacitor (N1) 106LG-2 as well as switch means (SS1) 106LG-3 and a capacitor (S1) 106LG-4 are respectively electrically connected in series, and connected as illustrated to the signal line 107LG.

In a third column reading circuit 102N that outputs a second signal 102SN, unlike the first column reading circuit 102HG and the second column reading circuit 102LG, an analog memory circuit portion 106N is directly electrically connected to the pixel output signal line 103 via a signal line 107N1.

In the analog memory circuit portion 106N, switch means (NS2) 106N-1 and a capacitor (N2) 106N-2 as well as switch means (SS2) 106N-3 and a capacitor (S2) 106N-4 are respectively electrically connected in series, and connected as illustrated to a signal line 107N2.

The column circuit portion 102 is common to each pixel circuit portion of one column.

With the circuit configuration in FIG. 1, it is possible to achieve both high sensitivity characteristics and high saturation characteristics of single photon detection, making it possible to provide a highly sensitive image sensor having a wide dynamic range performance.

In the example in FIG. 1, a total of three signal paths including a path via a high-gain amplifier (first column reading circuit portion 102HG), a path via a low-gain amplifier (second column reading circuit portion 102LG), and a path that directly connects the pixel signal output line (third column reading circuit portion 102N) are provided to each column, and two analog memories are arranged in each path.

The two gain amplifiers arranged in the column are used when the highly sensitive first signal is read from the pixel circuit portion 101, and produce the first (1-1) signal obtained by increasing the amplitude and reducing a later-stage noise and the first (1-2) signal having a signal amplitude left as is, thereby making it possible to obtain an ultra-highly sensitive signal and a highly sensitive signal. Further, the highly saturated second signal obtained by the pixel circuit portion 101 is read at a signal amplitude left as is using a path that directly connects the pixel signal output line, making it possible to obtain a highly saturated signal. That is, based on the three signals described above, the ultra-highly sensitive first (1-1) signal is used with extremely low illumination pixels, the second signal is used with high illumination pixels, and the first (1-2) signal is used with illumination pixels therebetween, making it possible to obtain video signals linearly using a single exposure period, from an extremely low illumination region to high illumination.

The letters of a reference number in the descriptions of FIG. 1 have the following technical meanings:
AMPEN: Switch for reading "first (1-1) signal" and "first (1-2) signal"
NS1H: Switch for sampling "first (1-1) BG signal"
SS1H: Switch for sampling "first (1-1) optical signal"
N1H: Capacitor for holding "first (1-1) BG signal"
S1H Capacitor for holding "first (1-1) optical signal"
NS1: Switch for sampling "first (1-2) BG signal"
SS1: Switch for sampling "first (1-2) optical signal"
N1: Capacitor for holding "first (1-2) BG signal"
S1: Capacitor for holding "first (1-2) optical signal"
NS2: Switch for sampling "second BG signal"
SS2: Switch for sampling "second optical signal"
N2: Capacitor for holding "second BG signal"
S2: Capacitor for holding "second optical signal"

The aspects of the present invention will now be described in accordance with FIGS. 2, 3A, 3B, 4A, and 4B.

FIG. 2 illustrates the pixel circuit portion 101 in the circuit 100 illustrated in FIG. 1.

The pixel circuit portion 101 comprises a photodiode (PD) 201, transfer switch means (T) 202, a floating diffusion capacitor ($C_{FD}$; also referred to as "$C_{FD}$ capacitor") 203 that performs charge-voltage conversion, a lateral overflow integration capacitor ($C_{LOFIC}$) 204, overflow switch means (S) 205, reset switch means (R) 206, pixel selection switch means (X) 207, and source follower switch means (SF) 208.

The overflow switch means (S) 205 is an overflow switch that combines or splits the potential of the $C_{FD}$ capacitor 203 and the lateral overflow integration capacitor ($C_{LOFIC}$) 204.

In FIG. 2, "VR" refers to reset voltage, and "VDD" refers to power source voltage.

In the present invention, the pixel circuit portion 101 is provided with the $C_{LOFIC}$ capacitor 204, and thus hereinafter is also referred to as the "LOFIC pixel portion."

Each switch means in the pixel circuit portion 101 in the present invention preferably comprises a field effect transistor (FET) such as a metal oxide semiconductor (MOS) transistor (MOSTr).

In FIG. 2, each of the switch means, including the transfer switch means (T) 202, the overflow switch means (S) 205, the reset switch means (R) 206, the pixel selection switch means (X) 207, and the source follower switch means (SF) 208 comprises a MOSTr.

The basic signal path in the present invention is as follows.

That is, light input to the PD 201 generates a photocharge, and the generated photocharge is converted to voltage using the capacitance of the Cm 203 and the total capacitance of the Cm 203 and the $C_{LOFIC}$ 204, read to the corresponding analog memory circuit portion of the analog memory circuit portions 106HG, 106LG, 106N via the SF 208, and held as a voltage signal in the analog memory of the analog memory circuit portion. Subsequently, the capacitance of the voltage signal is split from analog memory, read to an area outside the device via an output buffer (not illustrated), and converted to a digital signal by an analog-digital converter (ADC; not illustrated).

In this series of signal paths, noise is increasingly superimposed in the later stages of reading, causing a decrease in S/N. In the present invention, therefore, the charge-voltage conversion gain of the earliest stage possible of the reading path, particularly the $C_{FD}$ 203, is increased to the extent possible, thereby relatively reducing the noise of later stages of the reading path and increasing the S/N.

The present invention was made on the basis of the discovery that, in the repeatedly performed process of actually repeatedly designing and manufacturing an input sensor device, measuring the sensitivity characteristics of the sensor, analyzing and investigating the results, and then feeding back the investigation results to design and manufacturing on the basis of the pixel circuit portion 101 illustrated in FIG. 2, the object of the present invention was achieved if the (gate) overlap capacitors indicated by the dashed circles in FIG. 2 were optimized.

The capacitance constituting the capacitor ($C_{FD}$) 203 can be broadly divided into five types: a wiring parasitic capacitance (1) formed in a wiring portion of the device, a PN junction capacitance (2) formed in the FD diffusion layer portion, a gate/substrate parasitic capacitance (3) formed in the pixel SF portion, a channel capacitance (4), and a gate overlap capacitance (5) formed in the FD diffusion layer portion and the pixel SF portion.

Among the five capacitance types that constitute the capacitor ($C_{FD}$) 203, the wiring parasitic capacitance (1) can be minimized to a certain extent by closely wiring an FD diffusion layer portion 504 and a pixel SF portion 505 to shorten the wiring distance, and separating adjacent metal wiring to the extent possible. However, taking into consideration the fact that the size of the pixel circuit portion 101 (hereinafter also referred to as "pixel size") must be reduced on the basis of demands for increased device density, there is also a limit to the reduction of the wiring parasitic capacitance (1).

As a method for improving the gate/substrate parasitic capacitance (3), the gate/substrate parasitic capacitance (3) can be reduced by applying a special process called "Well in Well" to the pixel SF portion 505. However, due to problematic increases in process complexity and pixel size, adoption of the "Well in Well" process does not achieve both pixel size reduction and capacitance reduction.

Additionally, according to investigations of the present inventors, the gate/substrate parasitic capacitance (3) is small compared to other capacitance values, and thus the conclusion has been made that there is no need to improve the gate/substrate parasitic capacitance (3) at this point in time.

With regard to the channel capacitance (4), a channel for the flow of a constant current in the pixel SF portion 505 is required, and thus a substantial reduction in capacitance cannot be expected.

Given "Cch1" as the channel capacitance of the source follower switch means 208, the impact of the capacitance (Cch1) on the capacitor ($C_{FD}$) 203 is on the basis of a mirror effect, and thus the channel capacitance (4) is, in effect, a multiple of "1—Gain of the source follower switch means 208."

Thus, the channel capacitance (4) can be suppressed by utilizing the "Well in Well" process as described previously, removing the substrate bias effect, and setting the gain of the source follower switch means 208 to "1." However, with adoption of the "Well in Well" process both pixel size reduction and capacitance reduction are not achieved.

On the other hand, reduction of the PN junction capacitance (2) and gate overlap capacitance (5) cannot be expected using device layout or reading method schemes, and thus is improved in the present invention by changing the manufacturing process as described below. That is, in the present invention, reduction of the capacitance of the $C_{FD}$ 203 is optimized by significantly changing the conventional method so that the process of formation of the gate overlap capacitance (5) and the conditions thereof are as described later.

The aspects of the present invention will first be described with regard to omission of a lightly doped drain (LDD) made for reducing the gate overlap capacitance, using FIGS. 3A and 38.

FIG. 3A is a schematic structural cross-sectional view for explaining the structure of normal MOSTrs 301A1, 301A2.

FIG. 3B is a schematic structural cross-sectional view for explaining the structure of MOSTrs 301B1, 301B2 according to the present invention.

Normally, first formation of an LDD 305 is performed between creations of gate electrodes 303A, 303B, and creations of side walls 304A, 304B1, 304B2.

Next, the side walls 304A, 304B1, 304B2 are formed and a diffusion layer 302 is formed, in that order. The reason for providing the LDDs 305 is to prevent hot carrier deterioration of the formed MOSTrs. That is, a part of electrons that travel from the source to the drain are accelerated by a strong electric field near the drain and become hot carriers having high energy. The hot carriers generate high-energy electrons and holes by impact ionization, produce flaws near the boundary between the gate insulation film and semiconductor, or are injected into the gate insulation film and captured in flaws in the gate insulation film, resulting in a fixed charge and leading to the deterioration of the electrical characteristics of the transistor over time. This generation of hot carriers is remarkable in transistors having a channel length of 1 μm or less, and is a significant problem in general logic LSI miniaturization.

To suppress the generation of such hot carriers, a low-concentration diffusion layer for alleviating the electric field near the drain is formed. This is generally called an "LDD transistor." Additionally, in this specification, a transistor that does not have an LDD structure is also called a "non-LDD transistor."

With such an LDD transistor, problems such as the following occur.

As illustrated in FIG. 3A, the sections resulting from the LDDs 305 in the diffusion layer 302 section form sections that extend to the gate electrode 303A, 303B sides (indicated by the sections of the LDDs 305 that extend to both sides of the diffusion layer 302), causing the gate overlap capacitance to increase.

Here, in the present invention, with omission of formation of the LDDs 305, one factor for significantly reducing overlap capacitance was discovered. Furthermore, through transistor trial manufacture and measurement tests, it was discovered that, under the operating voltage conditions of the optical sensor, the impact of the hot carriers previously described is sufficiently small and thus problems do not arise even when formation of the LDDs 305 is omitted.

FIG. 3B illustrates an enlarged view of the gate overlap portion with formation of the LDD 305s omitted.

The process changes made for capacitance reduction are described below.

The PN junction capacitance is determined by the width of the depletion layer formed across the p-epi layer and the $n^+$ layer (diffusion layer). That is, the PN junction capacitance decreases as a width W of the depletion layer increases. The width W of this depletion layer is determined by the concentration of impurities in the p-epi layer and the $n^+$ layer.

In the present invention, the width W of the depletion layer is increased by decreasing the concentration of the impurities in the $n^+$ layer, thereby decreasing the PN junction capacitance.

FIGS. 4A and 4B schematically illustrate the expanse of the width W of the depletion layer formed when a diffusion layer 402A having a normal impurity concentration is provided, and when a diffusion layer 402B having an impurity concentration reduced to a value lower than normal as in the present invention is provided, respectively.

FIG. 4A is a schematic structural cross-sectional view schematically illustrating the expanse of the width W of the depletion layer formed when a diffusion layer having a normal impurity concentration is provided to the MOSTr with LDD formation omitted.

FIG. 4B is a schematic structural cross-sectional view schematically illustrating the expanse of the width W of the depletion layer formed when a diffusion layer having a impurity concentration reduced to a value lower than normal is provided to the MOSTr with LDD formation omitted as in the present invention.

FIG. 4A illustrates a part of the structures of MOSTr 401A1 and MOSTr 401A2.

The diffusion layer 402A comprises both a drain region (left side section of the diffusion layer 402A in the figure) of the MOSTr 401A1, and a source region (right side section of the diffusion layer 402A in the figure) of the MOSTr 401A2.

When the concentration of impurities in the diffusion layer 402A is high as usual, the width W of the depletion layer decreases as illustrated in FIG. 4A. When the concentration of the impurities in the diffusion layer 402B is low as in this specification, the width W of the depletion layer increases as illustrated in FIG. 4B.

The reduction in concentration of the impurities in the $n^+$ layer (diffusion layer) widens the depletion layer width of the PN junction, and thus has the effect of reducing PN junction capacitance. Furthermore, the distance between charge and the gate electrodes in the $n^+$ layer increases, resulting in the effect of reducing the gate overlap capacitance in the same way as omission of LDD formation.

FIG. 5 illustrates a preferred example of an embodiment of the present invention when the omission of LDD formation and the concentration reduction of the diffusion layer are applied as described in FIGS. 3A to 4B.

FIG. 5 is a schematic modification cross-sectional view for explaining the device structure layout when the omission of LDD formation and the concentration reduction of the diffusion layer are applied to formation of the a device structure of an optical input sensor pixel portion 500 comprising the same circuit configuration as the circuit configuration of the pixel circuit portion 101 illustrated in FIG. 2.

The extraction electrode (indicated by the solid line) in FIG. 5 is illustrated as a virtual electrode. Further, components that are the same as those in FIGS. 1 and 2 are denoted using the same reference numerals as FIGS. 1 and 2.

The optical input sensor pixel portion 500 is obtained by epitaxially growing a p type silicon layer 500-2 on an n⁻ type silicon (n⁻Si) substrate 500-1, and creating wiring with each electronic element, such as light-receiving diodes, transistors, and capacitive elements, on the basis of the circuit design illustrated in FIG. 2, utilizing the p type silicon layer 500-2.

In FIG. 5, the n type regions having a reduced doping amount of impurities compared to prior art in order to form a low capacitance FD are denoted by reference numerals 501-1, 501-2, 501-3.

Regions doped with impurity amounts at a high concentration as in prior art are n⁺ type regions 502-1, 502-2, 502-3, 502-4, 502-5.

Regions formed as LDDs as in prior art are n type regions 503-1, 503-2, 503-3, 503-4, 503-5, 503-6.

In the present invention, the n type regions (503-1 to 503-6) and the n⁺ type regions (502-1 to 502-5) described above are also referred to as "diffusion layers 502-1 to 502-5."

Element isolation regions 506-1, 506-2, 506-3, 506-4 having the required performance characteristics are provided to those electronic elements in which thorough element isolation contributes to increased device performance.

P type embedded regions 507-1, 507-2, 507-3 are provided to predetermined positions of the p type silicon layer 500-2.

In FIG. 5, the photodiode (PD) 201 comprises a diode structure in which an n⁻ region 508 and a p⁺ region 509 are layered.

In the present invention, the photodiode (PD) 201 can also be changed to a phototransistor.

Wiring ΦT is connected to an electrode 202-1 of the transfer switch means T202, wiring ΦS is connected to an electrode 205-1 of the overflow switch means S205, wiring ΦR is connected to an electrode 206-1 of the reset switch means R206, and wiring OX is connected to an electrode 207-1 of the pixel selection switch means (X) 207.

The n⁺ type region 502-1 functions as a drain of the reset switch means (R) 206, and is connected to wiring $V_R$ that imparts a reset voltage.

An electrode 208-1 of the source follower switch means (SF) 208 is electrically connected to the n type region 501-1.

An electrode 204-1 of the lateral overflow integration capacitor ($C_{LOFIC}$) 204 functions as one electrode of the capacitor ($C_{LOFIC}$) 204, and is electrically connected to the n type region 501-2.

The n⁺ type regions 502-2, 502-3 are directly electrically connected to wiring GND.

The n⁺ type region 502-5 is directly electrically connected to the pixel output signal line 103.

Each of the switch means illustrated in FIG. 5 comprises a MOSTr.

The aspects of the present invention are an FD diffusion portion 504 and a pixel SF portion 505.

In the FD diffusion portion 504, the conventional LDDs are omitted and the impurity concentration of the n type region 501-1 is reduced compared to prior art. As a result, reduction of the capacitance of the capacitor ($C_{FD}$) 203 is effectively improved.

In the n type region 501-3 of the pixel SF portion 505, the LDDs are omitted to reduce the capacitance of the capacitor ($C_{FD}$) 203, and the impurity concentration is reduced compared to prior art.

The n type region (diffusion layer) 501-2 is a diffusion layer connected to the capacitor ($C_{LOFIC}$) 204, and thus concentration reduction is improved to reduce the leak current to the capacitor ($C_{LOFIC}$) 204 rather than to reduce the capacitance of the capacitor ($C_{FD}$).

In the present invention, the degree to which the impurity concentrations of the n type regions 501-1, 501-3 are reduced is normally 50%, preferably 70%, and more preferably 90% with respect to the impurity contents of conventional practical elements (impurity contents of the n⁺ type regions 502-1 to 502-5).

Specifically, the impurity concentration is $1 \times 10^2$ impurities/cm³ or less, preferably $6 \times 10^{19}$ impurities/cm³ or less, and more preferably $2 \times 10^{19}$ impurities/cm³ or less.

In the present invention, the reduction of the impurity concentration of the n type regions 501-1, 501-3 effectively improves the reduction of the capacitance of the capacitor ($C_{FD}$) 203 as described above. However, reduction of the impurity concentrations of the n type regions 502-1, 502-4, 502-5, for example, causes an increase in series resistance and, as a result, narrows the pixel signal output voltage range and thus decreases the dynamic range, decreases the gain of the source follower circuit and thus decreases the S/N ratio, or causes shading. Thus, reducing the impurity concentrations of the n type regions 502-1, 502-4, 502-5 to a greater degree than those of conventional practical elements is not favorable in terms of the total device design.

From such perspectives, in the present invention, the impurity concentrations of the n type regions 501-1, 501-3 are preferably 50% or less than the impurity concentrations of the n⁺ type regions 502-1 to 502-5.

Such a device configuration as described above improves the capacitance reduction of the capacitor ($C_{FD}$), achieves both high sensitivity characteristics and high saturation characteristics of single photon detection, and allows provision of a highly sensitive image sensor having a wide dynamic range.

Omitting the LDDs increases ON resistance, and conceivably decreases the current that flows to the transistors illustrated in FIG. 5.

In particular, while the source follower switch means (SF) 208 requires the flow of a current of roughly several dozen μA to charge and discharge analog memory, verification of the impact of this increase in ON resistance revealed that such an increase is unproblematic in terms of practical use.

The transfer switch means (T) 202, the overflow switch means (S) 205, and the reset switch means (R) 206 do not require large current flow since they are used only for transferring the charge stored in the photodiode (PD) 201 and resetting the capacitance of the photodiode (PD) 201, the capacitance of the capacitor ($C_{FD}$) 203, and the capacitance of the capacitor ($C_{LOFIC}$) 204 (total capacitance: about several dozen fF), and thus are not impacted by the above.

When the series resistance of the source follower switch means (SF) 208 increases, the gain decreases. As a result, in the present invention, a decrease in gain is prevented by providing rather than omitting formation of the LDDs in the source portion of the MOS transistor of the switch means 208 as illustrated in FIG. 5, as in prior art.

Thus, in the present invention, selectively omitting LDD formation in the MOS transistor constituting the capacitor ($C_{FD}$) 203 reduces the gate overlap capacitance.

Next, a manufacturing example of the optical input sensor pixel portion 500 illustrated in FIG. 5 will be described using FIGS. 6A to 6L.

The manufacturing technique used is a normal semiconductor manufacturing technique, and thus descriptions are provided at a level that omits information (materials, chemicals, manufacturing conditions, manufacturing equipment, etc.) which is easily understood by a person skilled in the art.

The Step List below indicates the main steps of the manufacturing process.

However, in the steps below, step (9) is omitted in the present invention as described heretofore. Further, the steps (12) and (13) are steps for reducing the capacitance of the capacitor ($C_{FD}$) 203.

Step List
Step (1): Element isolation (shallow trench isolation: STI) (506-1 to 506-4) formation
Step (2): Injection of well/channel stop layer (507-1 to 507-3, 510) formation ions
Step (3): Activating anneal
Step (4) Gate insulation film formation
Step (5): Gate electrode film formation
Step (6): Gate electrode patterning
Step (7): Injection of PD embedded n$^-$ layer (508) formation ions
Step (8): Injection of PD surface p$^+$ layer (509) formation ions
Step (9): Injection of lightly doped drain (LDD) formation ions Photolithographing→Ion injection→Resist removal
Step (10): Activating anneal
Step (11): Side wall formation
Step (12): Injection of S/D diffusion layer (501-1 to 501-3, 502-1 to 502-5) formation ions (1) Photolithographing→Ion injection→Resist removal
Step (13): Injection of S/D high-concentration diffusion layer (502-1 to 502-5) formation ions (2) Photolithographing→Ion injection→Resist removal
Step (14): Activating anneal
Step (15): First interlayer film (605-1) formation
Step (16): Contact hole formation
Step (17): Contact electrode (606-1 to 606-3) formation
Step (18): Metal electrode (607-1, 607-2) formation
Step (19): Hydrogen sintering FIGS. 6A to 6L illustrate step diagrams of the main points in the step order described above.
FIG. 6A: Immediately after injection of PD surface p$^+$ layer (509) formation ions
FIG. 6B: Immediately after photolithographing for LDD formation ion injection
FIG. 6C: Immediately after LDD formation ion injection
FIG. 6D: Immediately after LDD formation ion injection and resist removal
FIG. 6E: Immediately after side wall (602-1 to 602-11) formation
FIG. 6F: Immediately after photolithographing for first ion injection during diffusion layer (501-1 to 501-3, 502-1 to 502-5) formation
FIG. 6G: Immediately after first ion injection for diffusion layer (501-1 to 501-3, 502-1 to 502-5) formation
FIG. 6H: Immediately after first ion injection and resist removal
FIG. 6I: Immediately after photolithographing for second ion injection during diffusion layer (502-1 to 502-5) formation
FIG. 6J: Immediately after second ion injection for diffusion layer (502-1 to 502-5) formation
FIG. 6K: Immediately after second ion injection and resist removal
FIG. 6L: Upon manufacturing process completion (equivalent to device structure in FIG. 5)

Next, a preferred example of a case where the present invention is applied to a highly sensitive CMOS image sensor (solid-state imaging device) as an image input device will be described using FIGS. 1 and 2.

While a photoelectron detection type is described here, an element structure having a reverse polarity also naturally falls within the realm of the present invention.

During a storage time (ST; the period in which a photocharge generated by the receipt of imaging light is stored to a predetermined capacitance), a supersaturation charge that flows out in a supersaturation state when storage into the photodiode (PD) 201 and the floating diffusion capacitor ($C_{FD}$) 203 exceeds the respective capacitance values thereof is stored in the lateral overflow integration capacitor ($C_{LOFIC}$) 204 via the overflow switch means (S) 205.

Charge-voltage conversion is performed in the capacitor ($C_{FD}$) 203 having a small capacitance value, and a first signal A1-1 is output from the pixel circuit portion. Next, at a large capacitance value obtained by adding together the capacitance of the floating diffusion capacitor ($C_{FD}$) 203 and the capacitance of the lateral overflow integration capacitor ($C_{LOFIC}$) 204, charge-voltage conversion is performed, and a second signal A1-2 is output from the pixel circuit portion.

Here, the charge-voltage conversion performed in the capacitor ($C_{FD}$) 203 having a small capacitance value, and the first signal A1-1 from a pixel circuit portion A1 is used for the imaging signal.

From a pixel circuit portion A2 having a large supersaturation charge as described above, the second signal A1-2 is used for the imaging signal.

The first signal A1-1 is output from the column circuit portion 102 as a first (1-1) signal 102S1 and a first (1-2) signal 102S2 via the first column reading circuit 102HG and the second column reading circuit 102LG, respectively.

In the prototype device of the present invention, the amplification factor of the high-gain amplifier 105HG is 16×, and the amplification factor of the low-gain amplifier 105LG is 1×, for example.

However, to make the signal/noise ratio when the first (1-1) signal 102S1 and the first (1-2) signal 102S2 are synthesized greater than or equal to a fixed value for both the first (1-1) signal 102S1 and the first (1-2) signal 102S2, a high signal amplification factor of the high-gain amplifier 105HG is preferred to reduce the impact of the noise generated in the circuits downstream of column circuit portion 102, when the difference between the amplification factors of the high-gain amplifier 105HG and the low-gain amplifier 105LG is within a fixed range.

The second signal A1-2 is output from the third column reading circuit 102N as the second signal 102SN.

The signal output from the column circuit portion 102 is read upon sequential column selection by a scanning circuit (not illustrated) installed in the horizontal direction.

Here, A/D conversion means (ADC) may be provided to each column reading circuit, each signal may be converted from analog to digital in each column inside the device chip, and the digital signal may be read to an area outside the device chip.

From the above, it is possible to synthesize the highly sensitive first (1-1) signal 102S1, the next highly sensitive first (1-2) signal 102S2, and the highly saturated second signal 102N and obtain a highly sensitive signal of the first (1-1) signal 102S1, as well as an imaging signal in a wide dynamic range by one exposure period.

That is, the signal obtained by synthesizing the "first (1-1) signal 102S1," the "first (1-2) signal 102S2," and the "second signal 102N" is an "imaging signal," and this "imaging signal" is obtained in a wide dynamic range at high sensitivity within one exposure period. In other words, the "imaging signal" is obtained in a wide range from a signal from a dark pixel of about one photon to a signal from a pixel having high illuminance within one exposure period. FIG. 7 conceptually explains this point.

FIG. 7 is a schematic explanatory conceptual view for explaining the photoelectric conversion characteristics of the first (1-1) signal 102S1, the first (1-2) signal 102S2, and the second signal 102N.

FIG. 8 is a graph showing the relationship between a number of noise electrons of floating diffusion input conversion and an erroneous reading probability.

Here, a case where photocharges input to the floating diffusion were read one by one was considered correct reading.

When the number of input conversion noise electrons was set to 0.26 or less, the erroneous reading probability could be made smaller than 5% and the signal could be read substantially unproblematically with a per photon accuracy. Further, it was also found that when the number of input conversion noise electrons was preferably set to 0.20 or less, the erroneous reading probability could be made smaller than 1%.

These results were confirmed by repeated device design, simulation, manufacture, device driving, analysis, and investigation.

FIG. 9 is a graph showing the relationship between the number of input conversion noise electrons and a charge-voltage conversion gain.

The method for performing imaging using an imaging device according to the present invention and reading an image signal based on the obtained image will now be described using FIGS. 10 and 11.

Here, the method for outputting a pixel signal of a device described below in the present invention is a method for outputting a pixel signal by a source follower circuit comprising the source follower switch (SF) 208 and the column current source 108.

The present invention is not limited to this pixel signal output method, and may be a floating capacitance load reading method for setting the pixel output line 103 into a floating state upon reset, driving the source follower switch (SF) by a capacitive load parasitic on the pixel output line 103, and outputting a pixel signal.

FIG. 10 is a timing diagram when a signal of one pixel is read.

In FIG. 10, when the transfer switch means (T) 202 is turned ON and OFF (pulse ST1) and then turned ON and OFF again (pulse ST2), the period from the OFF moment of the first ON and OFF to the ON moment of the next ON and OFF is the storage time (ST).

T1 to T5 each represent the timing of signal sampling completion of analog memory.

Signal sampling of analog memory starts when the pulse is ON.

During the period in which the overflow switch means (S) 205 and the pixel selection switch means (X) 207 maintain ON states for respective predetermined times (t1, t2), the reset switch means (R) 206 and the transfer switch means (T) 202 turn ON sequentially, and maintain an ON state for respective predetermined times (t3, t4).

The OFF timings of the overflow switch means (S) 205 and the pixel selection switch means (X) 207 are such that, after the overflow switch means (S) 205 turns OFF, the pixel selection switch means (X) 207 turns OFF.

Before the overflow switch means (S) 205 turns OFF, the reset switch means (R) 206 and the transfer switch means (T) 202 are turned ON and OFF (pulse $S_{R1}$ and pulse $S_{T1}$).

The ON/OFF timing of the transfer switch means (T) 202 is within the ON/OFF period ("predetermined time (t3)") of the reset switch means (R) 206.

After the transfer switch means (T) 202, the reset switch means (R) 206, and the overflow switch means (S) 205 sequentially turn OFF, the switch means (NS2) 106N-1 turns ON for a predetermined time (t5). After the predetermined time (t5) has elapsed, the switch means (NS2) 106N-1 turns OFF.

The OFF timing of this switch means (NS2) 106N-1 is before the overflow switch means (S) 205 turns OFF. Subsequently, the pixel selection switch means (X) 207 turns OFF.

When the pixel selection switch means (X) 207 turns ON once again, first the switch means (SW/AMPEN) 104HG and the switch means (SW/AMPEN) 104LG turn ON.

Next, the switch means (NS1H) 106HG-1 and the switch means (NS1) 106LG-1 are simultaneously turned ON and OFF (pulse SHG1 and pulse SLG1).

Next, the transfer switch means (T) 202 is turned ON and OFF (pulse ST2), and subsequently the switch means (SS1H) 106HG-3 and the switch means (SS1) 106LG-3 are simultaneously turned ON.

At the timing after the switch means (SS1H) 106HG-3 and the switch means (SS1) 106LG-3 simultaneously are turned OFF from this ON state, the switch means (SW/AMPEN) 104HG and the switch means (SW/AMPEN) 104LG are turned OFF (pulse SAM1 and pulse SAM2).

After the switch means (SW/AMPEN) 104HG and the switch means (SW/AMPEN) 104LG are turned OFF, the overflow switch means (S) 205 is turned ON (pulse SS2) and then the switch means (SS2) 106N-3 is turned ON and OFF (pulse SSS2).

Next, the reset switch means (R) 206 and the transfer switch means (T) 202 sequentially turn ON.

During the period that this overflow switch means (S) 205 is ON (width t1 of the pulse SS2), the transfer switch means (T) 202 and the reset switch means (R) 206 sequentially turn OFF (pulse ST3 and pulse SR2).

Next, the switch means (NS2) 106N-1 is turned ON and OFF (pulse SNS22). After this switch means (NS2) 106N-1 is turned OFF (pulse SNS22), the overflow switch means (S) 205 is turned OFF (pulse SS2).

Here, when a photocharge amount that exceeds the saturation charge amount of PD201 generates in the PD 201 within the storage time (ST), the photocharge overflows from the PD 201 beyond a potential barrier of the transfer switch means (T) 202 and into the capacitor FD 203.

Furthermore, when the photocharge amount that exceeds the saturation charge amount of the capacitor FD 203 overflows into the capacitor FD 203, the photocharge overflows from the capacitor ($C_{FD}$) 203 beyond a potential barrier of the switch means (S) 205 and into the integration capacitor ($C_{LOFIC}$) 204.

During the period that the switch means (X) 207 is ON (equivalent to pulse width t2 of pulse SX1 and pulse SX2), the pixel combines with the column output line 103 and the following signals are sequentially output.

When the switch means (SW/AMPEN) 104HG and the switch means (SW/AMPEN) 104LG are ON, the gain amplifier 105HG and the gain amplifier 105LG are active.

Before the transfer switch means (T) 202 is turned ON and within the storage time (ST), the switch means (SW/AMPEN) 104HG and the switch means (SW/AMPEN) 104LG are turned ON.

Subsequently, the switch means (NS1H) 106HG-1 and the switch means (NS1) 106LG-1 are turned ON and OFF (pulse $S_{HG1}$ and pulse $S_{LG1}$), the first (1-1) BG signal and the first (1-2) BG signal are each read, and the respective signals are held in the corresponding capacitor (N1H) 106HG-2 and the capacitor (N1) 106LG-2.

Here, the first (1-1) signal and the first (1-2) signal include signals equivalent to a reset noise (noise signals) of the capacitor ($C_{FD}$) 203, a threshold variance of the switch means (SF) 208, and an offset voltage of the gain amplifier 105HG and the gain amplifier 105LG.

Next, the transfer switch means (T) 202 is turned ON and OFF (pulse ST2), and the charge (also referred to as "photocharge") that generated inside the PD 201 by light reception is completely transferred to the floating diffusion capacitor ($C_{FD}$) 203.

At this time, when the charge amount of the photocharge is greater than the saturation charge amount of the capacitor ($C_{FD}$) 203, the supersaturation amount of the photocharge overflows beyond exceeds the potential of the switch means (S) 205 and into the integration capacitor ($C_{LOFIC}$) 204. The photocharge equivalent to the charge amount transferred to the capacitor ($C_{FD}$) 203 is subjected to charge-voltage conversion in accordance with the capacitance value of the capacitor ($C_{FD}$) 203.

After the transfer switch means (T) 202 is turned OFF (pulse ST2 OFF), the switch means (SS1H) 106HG-3 and the switch means (SS1) 106LG-3 are turned ON and OFF (pulse SHG3 and pulse SLG3), and the first (1-1) optical signal and the first (1-2) optical signal are respectively read and held in the corresponding capacitor (S1H) 106HG-4 and the capacitor (S1) 106LG-4. This signal reading end timing T3 is when the switch means (SS1H) 106HG-3 and the switch means (SS1) 106LG-3 are OFF.

Here, in addition to the first (1-1) BG signal and the first (1-2) BG signal, the signal generated in accordance with the charge amount of the photocharge transferred to the capacitor ($C_{FD}$) 203 is added to the first (1-1) optical signal and the first (1-2) optical signal, and correlation double sampling processing is performed, that is, the first (1-1) BG signal is subtracted from the first (1-1) optical signal and the first (1-2) BG signal is subtracted from the first (1-2) optical signal in a later stage circuit, thereby respectively obtaining only the signals generated in accordance with the charge amount of the photocharge. Naturally, a gain amplifier comprising a correlation double sampling function may be used for the gain amplifiers 105HG, 105LG.

After the first (1-1) optical signal is read to the capacitor (S1H) 106HG-4 and the first (1-2) optical signal is read to the capacitor (S1) 106LG-4, the switch means (SW/AMPEN) 104HG and the switch means (SW/AMPEN) 104LG are respectively turned OFF, and the gain amplifiers 105HG, 105LG are deactivated.

Subsequently, the switch means (S) 205 is turned ON, and potentials of the capacitor ($C_{FD}$) 203 and the integration capacitor ($C_{LOFIC}$) 204 are combined.

At this time, when there is a charge that overflows from the capacitor ($C_{FD}$) 203 and is stored in the integration capacitor ($C_{LOFIC}$) 204 within the storage time (ST) or within the storage time (ST) and a transfer time (TT), the charge of the charge amount stored in the integration capacitor ($C_{LOFIC}$) 204 and the charge of the charge amount transferred to and stored in the capacitor ($C_{FD}$) 203 are mixed together via the switch means (S) 205 and subjected to charge-voltage conversion according to the total capacitance of the integration capacitor ($C_{LOFIC}$) 204 and the capacitor ($C_{FD}$) 203.

When there is no overflow from the capacitor ($C_{FD}$) 203 and a charge is not stored in the integration capacitor ($C_{LOFIC}$) 204, the charge of the charge amount transferred to the capacitor ($C_{FD}$) 203 is subjected to charge-voltage conversion according to the total capacitance of the integration capacitor ($C_{LOFIC}$) 204 and the capacitor ($C_{FD}$) 203.

Here, to transfer to the capacitor ($C_{FD}$) 203 and the integration capacitor ($C_{LOFIC}$) 204 the photocharge which is stored in the photodiode (PD) 201 from the moment the transfer switch means (T) 202 is turned OFF by the ON and OFF operation at the pulse ST2, an operation of turning the transfer switch means (T) 202 ON and OFF with the switch means (S) 205 ON may be added.

Subsequently, the switch means (SS2) 106N-3 is turned ON and OFF (pulse SSS2) within the time (t1) that the switch means (S) 205 is ON, thereby reading and holding the second optical signal in the capacitor (S2) 106N-4. The reading end timing at this time is T4.

Next, the switch means (R) 206 is turned ON and the resetting of the integration capacitor ($C_{LOFIC}$) 204 and the capacitor ($C_{FD}$) 203 is started.

Subsequently, the transfer switch means (T) 205 is turned ON and the resetting of the PD 201 is started.

Next, the switch means (R) 206 is turned OFF and the resetting of the integration capacitor ($C_{LOFIC}$) 204 and the capacitor ($C_{FD}$) 203 is ended.

While reset noise is incorporated into the integration capacitor (CLOFIC) 204 and the capacitor (CFD) 203 at this time, it is possible to remove the reset noise as described previously and make only the signals corresponding to the amount of light received.

Subsequently, the switch means (NS2) 106N-1 is turned ON and OFF (pulse $S_{NS22}$), thereby reading and holding the second BG signal in the capacitor (N2) 106N-2.

Subsequently, the switch means (S) 205 is turned OFF, and the potentials of the integration capacitor ($C_{LOFIC}$) 204 and the capacitor ($C_{FD}$) 203 are not combined.

Next, the switch means (X) 207 is turned OFF, the pixel is disconnected from the output line, and the step transitions to the reading time of the pixels of another line.

FIG. 11 is a flowchart for explaining a procedure when a signal of one pixel is read.

When imaging is started (step 801), the decision is made as to whether or not it is prior to signal output preparation (step 802). If it is prior to signal output preparation, the flow transitions to step 803 of acquiring the photoelectric conversion characteristics of the first (1-1) signal 102S1, the first (1-2) signal 102S2, and the second signal 102N. When the acquisition of the photoelectric conversion characteristics of each signal ends, the flow transitions to step 804. If, in step 802, it is not prior to signal output preparation, the flow transitions to step 804. In step 804, the decision is made as to whether or not acquisition of the pixel signal has started. When pixel signal acquisition has started, the acquired pixel signal is stored in step 805. When pixel signal acquisition has not started, the flow returns once again to step 804, and the decision is made as to whether or not pixel signal acquisition has started. Each signal (first (1-1) signal 102S1, first (1-2) signal 102S2, and second signal 102N) stored in step 804 is output for transfer to the circuit of the next stage in step 806.

Next, the signal indicating the illuminance of the imaging surface is derived from the combination of the outputs of the first (1-1) signal 102S 1, the first (1-2) signal 102S2, and the second signal 102N (step 807). Subsequently, the derived signal is output for transfer to a predetermined circuit (step 808), and the series of reading operations is ended (step 809).

In the prototype device A according to the present invention, a high-gain amplifier was used for the column circuit portion 102, making it possible to set the noise voltage of the floating diffusion input conversion to 60 μV.

When the charge-voltage conversion gain was set to 230 μV/e⁻, the number of input conversion noise electrons could be set to 0.26, and the signal could be read substantially unproblematically with a per photon accuracy.

Further, when the charge-voltage conversion gain was set to 300 μV/e⁻, the number of input conversion noise electrons could be set to 0.20.

Here, the relationship between the charge-voltage conversion gain and floating diffusion capacitance is given by the formula below.

$$CG=q/C_{FD} \tag{1}$$

"CG" indicates charge-voltage conversion gain, "q" indicates element charge, and "$C_{FD}$" indicates floating diffusion capacitance.

In the trial manufacture of the prototype device A described above, a creation flow in which an n type region (LDD) formed by injecting n type impurities prior to side wall formation of the gate electrode, normally called LDD, is not formed in order to physically minimize overlap between the gate electrode and the n type diffusion layer, is described above, was used.

Further, after side wall formation, the ion injection step of injecting n type impurities at a high dose of an order of $10^{15}$ cm$^{-2}$ was changed, decreasing the dose of the n type impurities to $6\times10^{14}$ cm$^{-2}$, and reducing the concentration of the predetermined n type diffusion layer (n type regions 501-1, 501-2, 501-3).

As a result, the gate overlap capacitance was further reduced, and a reduction in PN junction capacitance could also be achieved. That is, in the prototype device A, it was possible to set the floating diffusion capacitance to 0.5 fF, the charge-voltage conversion gain to 320 μV/e⁻, and the number of input conversion noise electrons to 0.19, and read the signal with a one-photon accuracy. Furthermore, the first (1-1) signal, the first (1-2) signal, and the second signal were combined, making it possible to linearly obtain an imaging signal from one electron to 74,000 photons within one exposure period.

Next, FIGS. 12 and 13 illustrate an example of a preferred embodiment of a case where the present invention is applied to an imaging device.

FIG. 12 illustrates an example of a preferred embodiment of a sensor portion of a case where the CMOS image sensor according to the present invention is applied to an imaging device, and is a circuit diagram illustrating N pixel circuits in a first column and one column of reading circuits.

FIG. 12 illustrates a column pixel circuit portion 1200-1 of the first column and a column circuit portion 102-1 of the first column.

In the column pixel circuit portion 1200-1, N pixel (circuit) portions (101-1 to 101-N) are arranged as illustrated, and each of the pixel (circuit) portions (101-1 to 101-N) is sequentially connected to a pixel column signal line 103-1 of the first column.

While only one column of the column pixel circuit portion is illustrated in FIG. 12, M columns are actually arranged (1200-1 to 1200-M; 1200-2 to 1200-M are not illustrated).

A current source 108-1, similar to the case in FIG. 1, is connected downstream of the pixel column signal line 103-1.

The column circuit portion 102-1, similar to the case in FIG. 1, comprises a first column reading circuit 102HG-1 provided with a high-gain amplifier, a second column reading circuit 102LG-1 provided with a low-gain amplifier, and the third column reading circuit 102N.

Further, each of the column reading circuits (102HG-1, 102LG-1, 102N), similar to the case in FIG. 1, is provided with an analog memory circuit portion.

The method for reading the signal in the case in FIG. 12 is the same as that previously described except reading is repeated for N rows.

FIG. 13 is an overall block diagram schematically illustrating the entire sensor portion of the example of the imaging device illustrated in FIG. 12.

A sensor portion 1300 comprises a pixel array 1301 provided with "N×M" pixels comprising the pixel circuit portion (equivalent to one pixel) 101 illustrated in FIG. 1 arranged two dimensionally therein, a vertical (row) shift register portion 1302, and a horizontal (column) shift register portion 1303.

In the row direction of the pixel array 1301, the sensor portion 1300 comprises a current source column portion 1304 with M current sources 108 arranged therein, a reset switch column portion 1305 with M pixel output line reset switch means arranged therein, a first (1-1) signal analog memory portion 1307 with M analog memory circuit portions 106HG arranged therein, a first (1-2) signal analog memory portion 1309 with M analog memory circuit portions 106LG arranged therein, and a second signal analog memory portion 1310 with M analog memory circuit portions 106N arranged therein.

A 16× amplifier column portion 1306 is provided between the column reset switch portion 1305 and the first (1-1) signal analog memory portion 1307, and a 1x amplifier column portion 1308 is provided between the first (1-1) signal analog memory portion 1307 and the second signal analog memory portion 1310.

Here, the 16× amplifier column portion 1306 means that an amplifier having a 16× amplification factor is used as the high-gain amplifier, and the 1× amplifier column portion 1308 means that an amplifier having a 1× amplification factor is used as the low-gain amplifier.

A final stage buffer 1311 is a buffer for outputting the holding signal of analog memory of columns sequentially selected by a horizontal shift register to an area outside the chip using low output impedance.

Next, an example of an optimum design of the optical sensor of the present invention will be described.

FIGS. 14 to 16 are diagrams illustrating a schematic layout pattern of the pixel selection switch means (X) 207 and the source follower switch means (SF) 208.

(1) The gate overlap capacitance on the source follower gate drain side, which is a component of the floating diffusion capacitor, is proportional to the width ($W_{SF\_D}$) on the source follower gate drain side, and thus the width of the source follower gate is preferably small.

FIG. 14 is a preferred example of a layout pattern that prioritizes minimizing the width of the source follower gate to reduce the overlap capacitance.

$W_{SF\_D}$ is preferably designed with the smallest machining dimensions, and is set to 0.34 μm in the preferred specific example of the present invention.

(2) To increase the gain of the source follower circuit and reduce the low frequency noise consisting of l/F noise and random telegraph noise, the gate width of the source follower gate is preferably increased.

FIG. 15 is a preferred example of a layout pattern that prioritizes increasing the width of the source follower gate to increase the gain of the source follower circuit and reduce low frequency noise.

In the preferred specific example of the present invention, both $W_{SF\_S}$ and $W_{SF\_D}$ are set to 0.60 μm.

(3) FIG. 16 illustrates an example in which active Si is asymmetrically arranged in a channel region that covers gate polysilicon and active Si (offering the advantage of applying asymmetrically shaped active Si to the source follower gate).

When the active Si width is widened from $W_{SF\_D}$ to $W_{SF\_S}$ and an asymmetrical shape is formed, preferably the current path is gently widened, thereby laying out the active Si at a gentle angle with the direction of flow of the current that runs directly in the gate width direction serving as standard so that carrier scattering decreases.

In the preferred specific example of the present invention, the active Si is laid out at an incline of ±45° with the direction of current flow serving as standard.

Further, while deviation from design values occurs in the gate polysilicon and the active Si due to photolithography misalignment, a margin must be provided to ensure that the $W_{SF\_D}$ and $W_{SF\_S}$ values do not fluctuate even if misalignment occurs. Here, the designable range of $W_{SF\_S}$ is given by formula (2) below.

$$W_{SF\_D} \leq W_{SF\_S} \leq W_{SF\_D} + 2 \cdot L_{SF} - 2 \cdot L_M)$$ Formula (2)

Here, $L_M$ is the minimum value of the misalignment margin.

In FIG. 16, $L_M$ is indicated by $L_{M1}$, $L_{M2}$.

In the preferred specific example of the present invention, $L_M$ ($L_{M1}$, $L_{M2}$)=0.10 μm.

$W_{SF\_D}$ is preferably designed using the smallest machining dimensions.

In the preferred specific example of the present invention, $W_{SF\_D}$ is set to 0.34 μm. Further, $L_{SF}$ is set to 0.55 μm. Thus, the maximum designable $W_{SF\_S}$ value at this time is 1.04 μm.

In the preferred specific example of the present invention, $W_{SF\_S}$ is set to 0.60 μm.

In the present invention, the layout is designed so as to satisfy the above conditions (1) to (3), making optimization possible.

In the most preferred example, the active Si is asymmetrically arranged and the gate width ($W_{SF\_D}$) on the drain side is minimized to reduce the gate overlap capacitance, and the gate width ($W_{SF\_S}$) on the source side is increased, making it possible to achieve both an increase in gain of the source follower circuit and a reduction in low frequency noise.

DESCRIPTIONS OF REFERENCE NUMERALS

100: Pixel circuit and one column of reading circuits
101: Pixel circuit portion
101-1 to 101-N: Pixel portion
102, 102-1: Column circuit portion
102HG, 102HG-1: First column reading circuit
102LG, 102LG-1: Second column reading circuit
102N, 102N-1: Third column reading circuit
102S1: First (1-1) signal
102S2: First (1-2) signal
102SN: Second signal
103, 103-1: Pixel column output signal line
104HG: Switch means (SW/AMPEN)
104LG: Switch means (SW/AMPEN)
105HG: High-gain amplifier
105LG: Low-gain amplifier
106HG: Analog memory circuit portion
106LG: Analog memory circuit portion
106N: Analog memory circuit portion
106HG-1: Switch means (NS1H)
106LG-1: Switch means (NS1)
106N-1: Switch means (NS2)
106HG-2: Capacitor (N1H)
106LG-2: Capacitor (N1)
106N-2: Capacitor (N2)
106HG-3: Switch means (SS1H)
106LG-3: Switch means (SS1)
106N-3: Switch means (SS2)
106HG-4: Capacitor (S1H)
106LG-4: Capacitor (S1)
106N-4: Capacitor (S2)
107HG: Signal line for first (1-1) signal
107LG: Signal line for first (1-2) signal
107N1: Signal line for second signal from pixel column output signal line
108, 108-1: Current source
201: Photodiode (PD)
202: Transfer switch means (T)
202-1: Electrode of transfer switch means (T)
203: Floating diffusion capacitor ($C_{FD}$)
204: Lateral overflow integration capacitor ($C_{LOFIC}$)
205: Overflow switch means (S)
205-1: Electrode of overflow switch means (S)
206: Reset switch means (R)
206-1: Electrode of reset switch means (R)
207: Pixel selection switch means (X)
207-1: Electrode of pixel selection switch means (X)
208: Source follower switch means (SF)
208-1: Electrode of source follower switch means (SF)
300: p⁻ type epi substrate
301A1, 301A2, 301B1, 301B2: MOS transistor
302: Diffusion layer (n; type region)
303A, 303B: Gate electrode
304A, 304B1, 304B2: Side wall
305: LDD.
306: Insulation film layer
400: p⁻ type epi substrate
401A1, 401A2: MOS transistor
402A: Diffusion layer (n⁺ type region)
403A, 403B: Gate electrode
404A, 404B1, 403B2: Side wall
500: Optical input sensor pixel portion
500-1: n⁻ type silicon (n⁻Si) substrate
500-2: p type silicon layer
501-1 to 501-3: Impurity reduction n type region
502-1 to 502-5: n⁺ type region
503-1 to 503-6: LDD
504: FD diffusion layer portion
505: Pixel SF portion
506-1 to 506-4: Element isolation region 507-1 to 507-3: p type embedded region
508: n⁻ type region
509: p⁺ type region
510: STI periphery p⁺ type region
601-1 to 601-3: LDD formation photoresist
602-1 to 602-11: Side wall
603-1 to 603-2: S/D diffusion layer formation photoresist
604-1 to 604-3: S/D high concentration diffusion layer formation photoresist
605-1 to 605-2: Wiring interlayer insulator layer
606-1 to 606-3: Contact electrode
607-1 to 607-2: Metal wiring
801 to 809: Signal reading step
1200-1: Column circuit portion of first column
1300: Sensor portion
1301: Pixel array
1302: Vertical shift resistor
1303: Horizontal shift resistor
1304: Current source column portion
1305: Pixel output line reset switch column portion
1306: 16× amplifier portion
1307: First (1-1) signal analog memory portion
1308: 1× amplifier column portion
1309: First (1-2) signal analog memory portion
1310: Second signal analog memory portion
1311: Final stage buffer

What is claimed is:

1. An optical sensor comprising:
a light-receiving element (PD), a transfer switch (T), an overflow switch (S), and a reset switch (R) connected in series in this order;
a floating diffusion capacitor ($C_{FD}$) and a source follower switch (SF) connected to wiring between the transfer switch (T) and the switch (S); and
a lateral overflow integration capacitor ($C_{LOFIC}$) connected to wiring between the switch (S) and the reset switch (R), wherein
the source follower switch (SF) is a MOS transistor, and
the transfer switch (T) is a non-LDD/MOS transistor for which the impurity concentration of a drain region is 50% less than an impurity concentration of a source region of the source follower switch (SF).

2. An optical sensor comprising:
a light-receiving element, storage capacitors that store a charge, a transfer switch for transferring to the storage capacitors a charge generated by light input to the light-receiving element, and a pixel signal output line per pixel; and
a signal reading path connected to the pixel signal output lines, wherein
the storage capacitors are a floating diffusion capacitor and a lateral overflow integration capacitor, and the transfer switch is a non-LDD/MOS transistor for which the impurity concentration of a drain region thereof is $1 \times 10^{20}$ impurities/cm³ or less,
the signal reading path receives a first pixel output signal subjected to charge-voltage conversion by the floating diffusion capacitor, and a second pixel output signal subjected to charge-voltage conversion by combining the floating diffusion capacitor and the lateral overflow integration capacitor, and
the first pixel output signal is amplified in the signal reading path by a plurality of amplifiers that include at least one amplifier having an amplification factor greater than 1.

3. A multi-pixel optical sensor comprising:
a light-receiving element, storage capacitors that store a charge, and a transfer switch for transferring to the storage capacitors a charge generated by light input to the light-receiving element, the storage capacitors being a floating diffusion capacitor and a lateral overflow integration capacitor, and the transfer switch being a non-LDD/MOS transistor for which an impurity concentration of a drain region thereof is $1 \times 10^{20}$ impurities/cm³ or less;
pixel column portions having pixel portions planarly arranged therein;
a pixel signal output line having the pixel column portions connected sequentially thereto; and
a signal reading path portion connected to the pixel signal output at a position downstream from a position where a last pixel portion of an array of the pixel column portions of the pixel signal output line is connected, wherein
the signal reading path portion comprises a plurality of signal paths, and at least two of the plurality of signal paths are respectively provided with amplification functions having different amplification factors, and
at least one of the amplification functions has an amplification factor greater than 1.

4. A signal reading method for an optical sensor comprising:
a light-receiving element, storage capacitors that store a charge, and a transfer switch for transferring to the storage capacitors a charge generated by light input to the light-receiving element, per pixel portion;
a sensor portion in which the storage capacitors are a floating diffusion capacitor and a lateral overflow integration capacitor, and the transfer switch is a non-LDD/MOS transistor for which the impurity concentration of a drain region thereof is $1 \times 10^{20}$ impurities/cm³ or less;
a pixel signal output line having each pixel portion connected thereto; and
a signal reading path connected to the pixel signal output line,
the signal reading method comprising the steps of:
forming a first pixel output signal by converting a charge of a charge amount that contributes to reading by the floating diffusion capacitor to voltage, forming a second pixel output signal by combining the floating diffusion capacitor and the lateral overflow integration capacitor and converting a charge of a charge amount that contributes to reading to voltage, and inputting these two pixel output signals to the signal reading path, wherein
the first pixel output signal is amplified in the signal reading path by a plurality of amplifiers that include at least one amplifier having an amplification factor greater than 1.

5. An imaging device comprising:
a light-receiving element (PD), a transfer switch (T), an overflow switch (S), and a reset switch (R) connected in series in that order, a floating diffusion capacitor ($C_{FD}$) and a source follower switch (SF) connected to wiring between the transfer switch (T) and the switch (S), and a lateral overflow integration capacitor ($C_{LOFIC}$) connected to wiring between the switch (S) and the reset switch (R), wherein
the source follower switch (SF) is a MOS transistor,
the transfer switch (T) comprises a plurality of pixel portions serving as non-LDD/MOS transistors for which the impurity concentration of a drain region is 50% less than an impurity concentration of a source region of the source follower switch (SF), and the light-receiving elements (PD) of the plurality of pixel portions are arranged two-dimensionally and comprise a pixel array, the plurality of pixel portions comprises pixel column output signal lines that are sequentially connected, the pixel column output signal line comprises a column circuit portion connected thereto, and the column circuit portion receives a first pixel output signal subjected to charge-voltage conversion by the floating diffusion capacitor, and a second pixel output signal subjected to charge-voltage conversion by combining the floating diffusion capacitor and the lateral overflow integration capacitor, and the first pixel output signal is amplified in the signal reading path by a plurality of amplifiers that include at least one amplifier having an amplification factor greater than 1.

6. A signal reading method for an imaging device comprising:

a light-receiving element (PD), a transfer switch (T), an overflow switch (S), and a reset switch (R) connected in series in that order, a floating diffusion capacitor ($C_{FD}$) and a source follower switch (SF) connected to wiring between the transfer switch (T) and the switch (S), and a lateral overflow integration capacitor ($C_{LOFIC}$) connected to wiring between the switch (S) and the reset switch (R), wherein the source follower switch (SF) is a MOS transistor, the transfer switch (T) comprises a plurality of pixel portions serving as non-LDD/MOS transistors for which the impurity concentration of a drain region is 50% less than an impurity concentration of a source region of the source follower switch (SF), the light-receiving elements (PD) of the plurality of pixel portions are arranged two-dimensionally to constitute a pixel array, the plurality of pixel portions is sequentially connected to a pixel column output signal line, and the pixel column output signal line is connected to a column circuit portion, the signal reading method comprising the steps of:

forming a first pixel output signal by converting a charge of a charge amount that contributes to reading by the floating diffusion capacitor to voltage, forming a second pixel output signal by combining the floating diffusion capacitor and the lateral overflow integration capacitor and converting a charge of a charge amount that contributes to reading to voltage, and inputting these two pixel output signals to the signal reading path, wherein the first pixel output signal is amplified in the signal reading path by a plurality of amplifiers that include at least one amplifier having an amplification factor greater than 1.

* * * * *

UNITED STATES PATENT AND TRADEMARK OFFICE
CERTIFICATE OF CORRECTION

PATENT NO. : 10,200,641 B2
APPLICATION NO. : 15/524701
DATED : February 5, 2019
INVENTOR(S) : Shigetoshi Sugawa et al.

It is certified that error appears in the above-identified patent and that said Letters Patent is hereby corrected as shown below:

In the Specification

Column 2:
Line 30, "$1\times10^{2}$" should read --$1\times10^{20}$--; and
Line 35, "(CD)" should read --($C_{FD}$)--.

Column 5:
Line 32, "FIG. 6H." should read --FIG. 6G.--;
Line 34, "FIG. 6." should read --FIG. 6I.--; and
Line 35, "FIG. 6K." should read --FIG. 6J.--.

Column 6:
Line 41, "10252" should read --102S2--; and
Line 42, "10SLG" should read --105LG--.

Column 8:
Line 14, "$C_m$ 203" should read --$C_{fd}$ 203--; and
Line 15, "$C_m$ 203" should read --$C_{fd}$ 203--.

Column 9:
Line 37, "and 38." should read --and 3B.--.

Column 11:
Line 53, "OX" should read --$\Phi$X--.

Column 16:
Line 66, "¶Furthermore," should read --Furthermore,--.

Column 19:
Line 43, "is" should read --as--.

Signed and Sealed this
Third Day of December, 2019

Andrei Iancu
*Director of the United States Patent and Trademark Office*

Column 20:
Line 50, "Ix" should read --1x--.

Column 21:
Line 39, "$W_{SF\_D} \leq W_{SF\_S} \leq W_{SF\_D} + 2 \cdot L_{SF} - 2 - L_M$)" should read --$W_{SF\_D} \leq W_{SF\_S} \leq W_{SF\_D} + 2 \cdot (L_{SF} - 2 \cdot L_M)$--.